United States Patent

Inasaka

Patent Number: 5,271,150
Date of Patent: Dec. 21, 1993

[54] METHOD FOR FABRICATING A CERAMIC MULTI-LAYER SUBSTRATE

[75] Inventor: Jun Inasaka, Tokyo, Japan

[73] Assignee: NEC Corporation, Tokyo, Japan

[21] Appl. No.: 43,524

[22] Filed: Apr. 6, 1993

[30] Foreign Application Priority Data

Apr. 6, 1992 [JP] Japan .................................. 4-083812
Apr. 7, 1992 [JP] Japan .................................. 4-084328

[51] Int. Cl.$^5$ .............................................. H01K 3/10
[52] U.S. Cl. ........................................ 29/852; 29/630; 156/89; 174/36; 428/901
[58] Field of Search ...................... 29/852, 830; 174/36; 439/85; 428/901; 264/61; 156/89, 902

[56] References Cited

U.S. PATENT DOCUMENTS

| | | | |
|---|---|---|---|
| 3,795,047 | 3/1974 | Abolafia et al. | 29/830 X |
| 4,736,521 | 4/1988 | Dohya | 29/830 |
| 4,754,371 | 6/1988 | Nitta et al. | 174/36 X |
| 5,220,723 | 6/1993 | Okada | 29/830 |

FOREIGN PATENT DOCUMENTS

| | | | |
|---|---|---|---|
| 276004 | 7/1988 | European Pat. Off. | 439/85 |
| 0456243 | 11/1991 | European Pat. Off. | |
| 257536 | 6/1988 | Fed. Rep. of Germany | 439/85 |
| 310592 | 12/1989 | Japan | 439/85 |
| 9213435 | 8/1992 | World Int. Prop. O. | |

OTHER PUBLICATIONS

K. Ohtsuka, "Multilayer Ceramic Substrate—Technology for VLSI Package/Multichip Module", published by Uchida Rokakuho, pp. 1-4.

A. Blodgett, Jr., "A Multi-Layer Ceramic, Multi-Chip Module", 30th Electronic Components Conference, San Francisco, Calif., Apr. 1980, pp. 283-285.

Primary Examiner—Carl J. Arbes
Attorney, Agent, or Firm—Sughrue, Mion, Zinn, Macpeak & Seas

[57] ABSTRACT

A method for fabricating a ceramic multi-layer substrate by a greensheet process includes a step of bonding an organic resin film on a ceramic greensheet cast on a carrier film; a step of forming a through-hole on said ceramic greensheet in a state in which this ceramic greensheet retains one or both of said films and filling conductive paste in said through-hole by using one of said films as a mask; a step of removing one of said films, placing said ceramic greensheet on a stack of ceramic greensheets forming a base, forming a laminate assembly by applying pressure thereto, and removing the other of said films remaining in said assembly. It is possible to suppress the occurrence of deformation in dimensions of greensheets when they are processed and of displacement or misalignment when they are laminated.

10 Claims, 38 Drawing Sheets

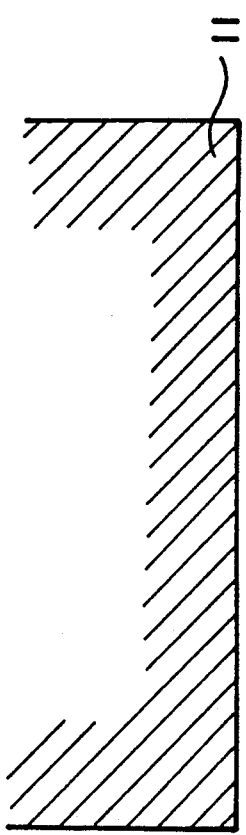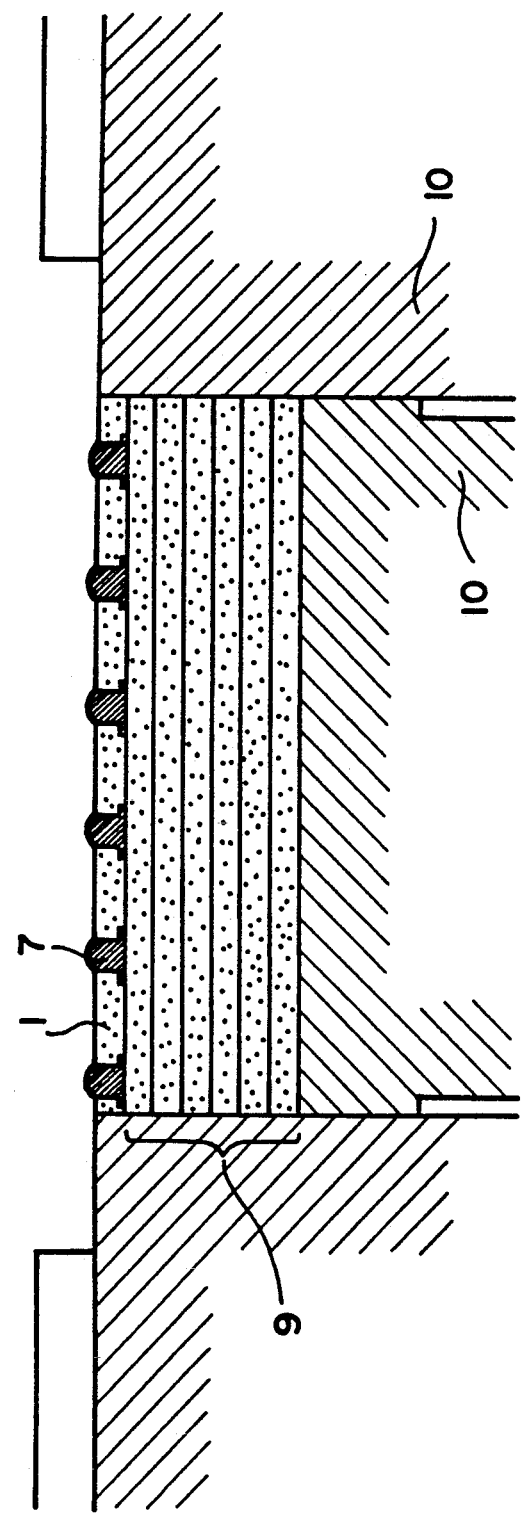
FIG.15

METHOD FOR FABRICATING A CERAMIC MULTI-LAYER SUBSTRATE

BACKGROUND OF THE INVENTION (1) Field of the Invention

The present invention relates to a method for fabricating a ceramic multi-layer substrate.

(2) Description of the Related Art

In a conventional method for fabricating a ceramic multi-layer substrate by a ceramic greensheet fabrication technology, a slurry is cast on a carrier film by using a doctor blade and is dried to produce a ceramic greensheet. The dried ceramic greensheet is separated from the carrier film and is cut into sheets of desired sizes. Then, in each of such separated greensheets, alignment holes are punched, through-holes are formed, and through-hole filling and conductive paste printing are performed. The resulting greensheets are stacked and thermally laminated together and are sintered, whereby a ceramic multi-layer substrate is achieved.

In the conventional method for fabricating a ceramic multi-layer substrate explained above, the ceramic slurry is cast on the carrier film and the resulting ceramic greensheet is separated from the carrier film, followed by other fabrication processes. The ceramic greensheet tends to be deformed due to any deformation to develop during the formation of the through-holes, the filling of conductive paste into the through-holes and the printing of conductive patterns and any unsatisfactory state of keeping the ceramic greensheet. This results in misalignment of the through-holes when the ceramic greensheets are stacked, which is a detriment in the conventional method.

SUMMARY OF THE INVENTION

An object of the present invention is to provide a method for fabricating a ceramic multi-layer substrate by a greensheet process, which is capable of suppressing the occurrence of deformation in dimensions of greensheets during the period in which various processes are carried out and also suppressing to the minimum any displacement in or misalignment of layers of greensheets when they are laminated.

Another object of the invention is to provide a method for fabricating a ceramic multi-layer substrate in which, during the period in which various processes are carried out, a greensheet remains sandwiched between a carrier film and an organic resin film or either on the carrier film or the organic resin.

According to one aspect of the invention, there is provided a method for fabricating a ceramic multi-layer substrate by a greensheet process, the method comprising the steps of:

a first step including bonding an organic resin film on a ceramic greensheet cast on a carrier film;

a second step including forming a through-hole on the ceramic greensheet in a state in which this ceramic greensheet retains one or both of the films and filling conductive paste in the through-hole by using one of the films as a mask; and a third step including removing one of the films, placing the ceramic greensheet on a stack of ceramic greensheets forming a base, forming a laminate assembly by applying pressure thereto, and removing the other of the films remaining in the assembly.

BRIEF DESCRIPTION OF THE DRAWINGS

The above and other objects, features and advantages of the present invention will be apparent from the following description of preferred embodiments of the invention explained with reference to the accompanying drawings, in which:

FIG. 15 is a sectional view of the ceramic greensheet from which the carrier film shown in FIG. 14 has been removed;

FIGS. 19–29 show a second embodiment of the invention, wherein

FIG. 19 is a sectional view of a structure in which an organic resin film is bonded on the ceramic greensheet shown in FIG. 1 and in which the carrier film is being removed;

FIG. 20 is a sectional view showing a state in which the ceramic greensheet and the organic resin film shown in FIG. 19 are cut and bonded on a frame;

FIG. 21 is a sectional view showing a state in which a through-hole is formed through the ceramic greensheet and the organic resin film shown in FIG. 20;

FIG. 22 is a sectional view showing a state in which conductive paste is filled in the through-hole shown in FIG. 21;

FIG. 23 is a sectional view of the ceramic greensheet in which the through-hole has been filled with conductive paste in the manner shown in FIG. 22;

FIG. 24 is a sectional view showing a state in which a conductive pattern is formed on the greensheet shown in FIG. 23;

FIG. 25 is a sectional view showing a state in which the ceramic greensheet shown in FIG. 24 is positioned in alignment with the base shown in FIG. 9;

FIG. 26 is a sectional view showing a state in which the base shown in FIG. 25 and the ceramic greensheet are being bonded together;

FIG. 27 is a sectional view showing a state in which the ceramic greensheet shown in FIG. 26 is being cut by the metal die and an upper punch;

FIG. 28 is a sectional view showing a state in which the cutting of the ceramic greensheet as shown in FIG. 27 has been completed; and FIG. 29 is a sectional view showing a state in which the organic resin film is being removed from the ceramic greensheet shown in FIG. 28.

FIGS. 30-40 shows a third embodiment of the present invention, wherein

FIG. 30 is a sectional view showing a state in which an organic resin film is bonded on the ceramic greensheet cast on the carrier film;

FIG. 31 is a sectional view showing a state in which the greensheet, the carrier film and the organic resin film shown in FIG. 30 are cut and bonded to a frame;

FIG. 32 is a sectional view showing a state in which a through-hole is formed all through the ceramic greensheet, the carrier film and the organic resin film shown in FIG. 31;

FIG. 33 is a sectional view showing a state in which conductive paste is filled in the through-hole shown in FIG. 32;

FIG. 34 is a sectional view showing a state in which the carrier film has been removed from the ceramic greensheet shown in FIG. 33;

FIG. 35 is a sectional view showing a state in which a conductive pattern is formed on the greensheet shown in FIG. 34;

FIG. 36 is a sectional view showing a state in which the ceramic greensheet shown in FIG. 35 is positioned in alignment with the base;

FIG. 37 is a sectional view showing a state in which the base 9 shown in FIG. 36 and the ceramic greensheet are being bonded together;

FIG. 38 is a sectional view showing a state in which the ceramic greensheet 1 shown in FIG. 37 is being cut by the metal die and an upper punch;

FIG. 39 is a sectional view showing a state in which the cutting of the ceramic greensheet as shown in FIG. 38 has been completed; and FIG. 40 is a sectional view showing a state in which the organic resin film is being removed from the ceramic greensheet shown in FIG. 39.

DESCRIPTION OF THE PREFERRED EMBODIMENTS

Throughout the following explanation, similar reference symbols or numerals refer to the same or similar elements in all figures of the drawings.

FIGS. 1-18 are diagrammatic sectional views of a ceramic multi-layer substrate of a first embodiment according to the invention for explanation of the fabrication steps thereof.

Figure 1:
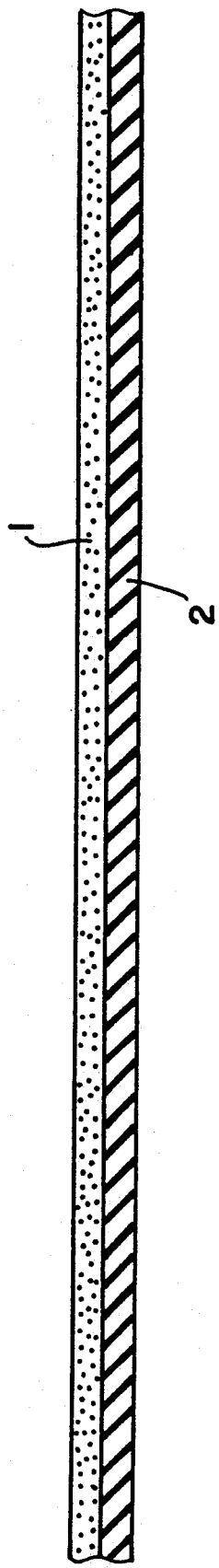
FIG. 1 is a sectional view of a ceramic greensheet cast on a carrier film according to a first embodiment of the invention.

FIG. 1 shows a ceramic greensheet 1 cast on a carrier film 2 by using a doctor blade technology. In this case, the thickness of the greensheet may be 100 $\mu$m and that of the carrier film may be 100 $\mu$m.

Here, the thickness of the carrier film is required to be changed depending on the width of the greensheet to be cast. That is, if the casting is to be made in a large width (width > 300 mm), the thickness of the carrier film may appropriately be in the order of 100 $\mu$m because, if thinner, the carrier film tends to deform in a wave form since the carrier film itself is pulled in the direction of formation of the ceramic greensheet by the tension created from the rolling up of the carrier film.

The thickness of the cast ceramic greensheet 1 is determined by the structural, electrical and mechanical characteristics of the ceramic multi-layer substrate to be achieved but such thickness may appropriately be in the order of 50-400 $\mu$m.

Figure 2:
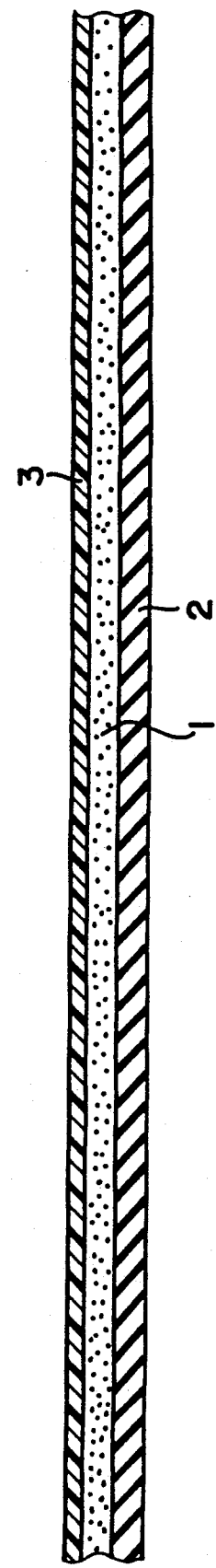
FIG. 2 is a sectional view of a structure in which an organic resin film is bonded on the ceramic greensheet shown in FIG. 1.

FIG. 2 is a diagrammatic sectional view of a structure in which an organic resin film 3 is fixed or bonded on a surface of the cast ceramic greensheet 1. This organic resin film which is fixed on the ceramic greensheet 1 serves to suppress the changes in dimensions of the ceramic greensheet 1 caused by the subsequent processes or the changes in dimensions due to environmental conditions such as process temperatures and humidities.

In this case, the adhesive for bonding the organic resin film 3 must be one which does not have properties to give damage to the binder of the ceramic greensheet 1 and in which adhesive power is appropriately adjusted in consideration of the film separability in the subsequent processes. The organic resin film 3 must be firmly bonded on the ceramic greensheet 1 so that no bubble is introduced therebetween.

The organic resin film 3 may be 30-100 $\mu$m thick and, as material therefor, oriented polypropylene and polyethylene in addition to polyester may be considered appropriate. It is necessary to select material which is good in absorptivity, durability and climate-resistance and small in changes in dimensions.

Figure 3:
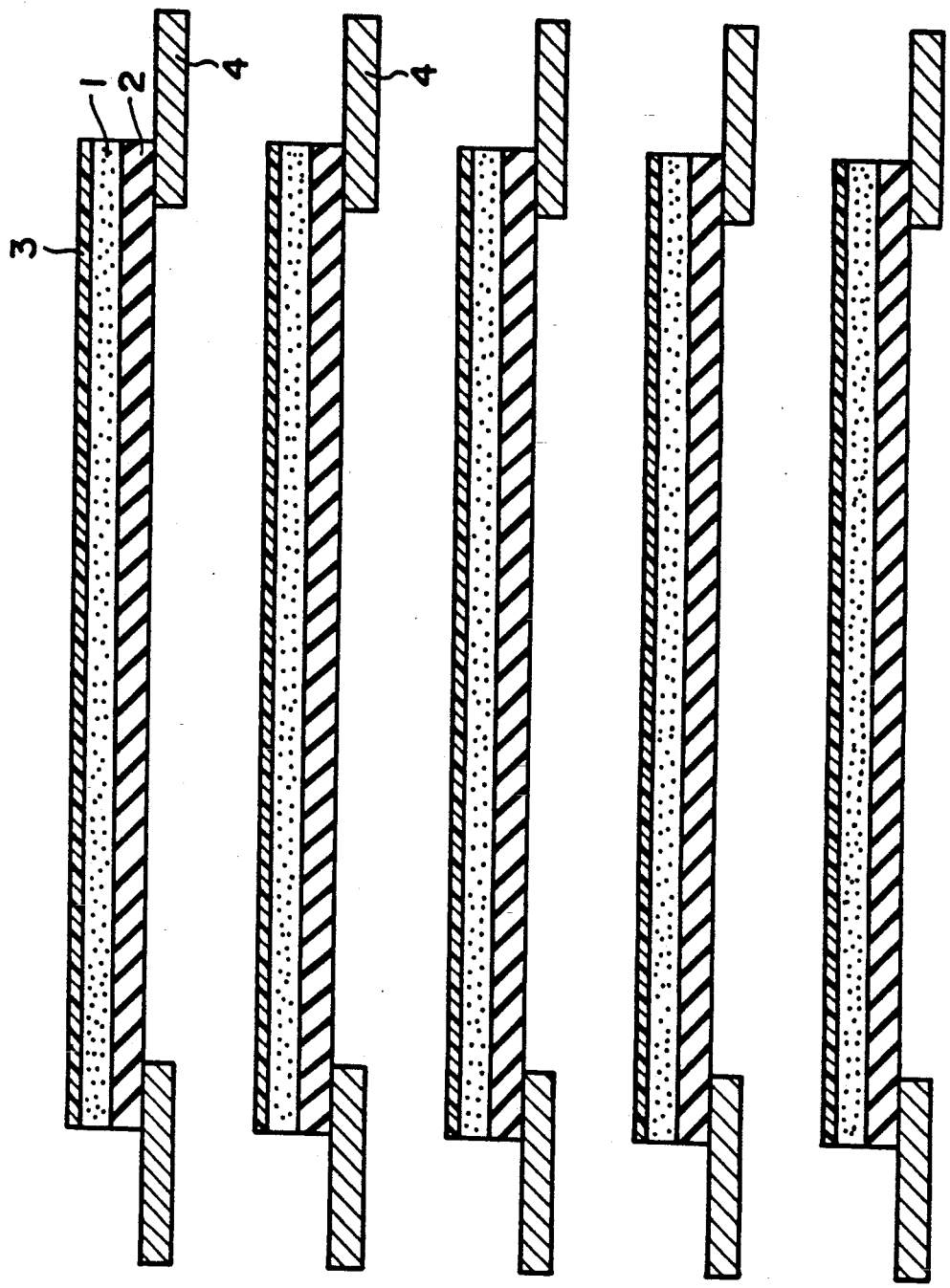
FIG. 3 is a sectional view showing a state in which the ceramic greensheet, the carrier film and the organic resin film shown in FIG. 2 are cut and bonded on a frame.

FIG. 3 shows a state in which the ceramic greensheet 1 together with the carrier film 2 and the organic resin film 3 is cut into sheets of a desired size and the peripheral portions of each of the carrier films 2 are fixed to a frame 4 for process-handling by adhesive (in the drawings, five layers of the greensheets shown as being aligned in positions for facilitating the understanding of the relationship between them, which is the same in the remaining drawings). In this state, the ceramic greensheet 1 is sandwiched between the carrier film 2 and the organic resin film 3.

The frame 4 is made of, for example, stainless steel and the size thereof which is determined by the size of the substrate to be completed may be 400 mm × 400 mm and 300 mm × 300 mm in its outer diameter and inner diameters, respectively, and 1 mm in its thickness. In each step of the remaining processes, the aligning of patterns with pattern references is effected by aligning the positions of the frames 4.

Figure 4:
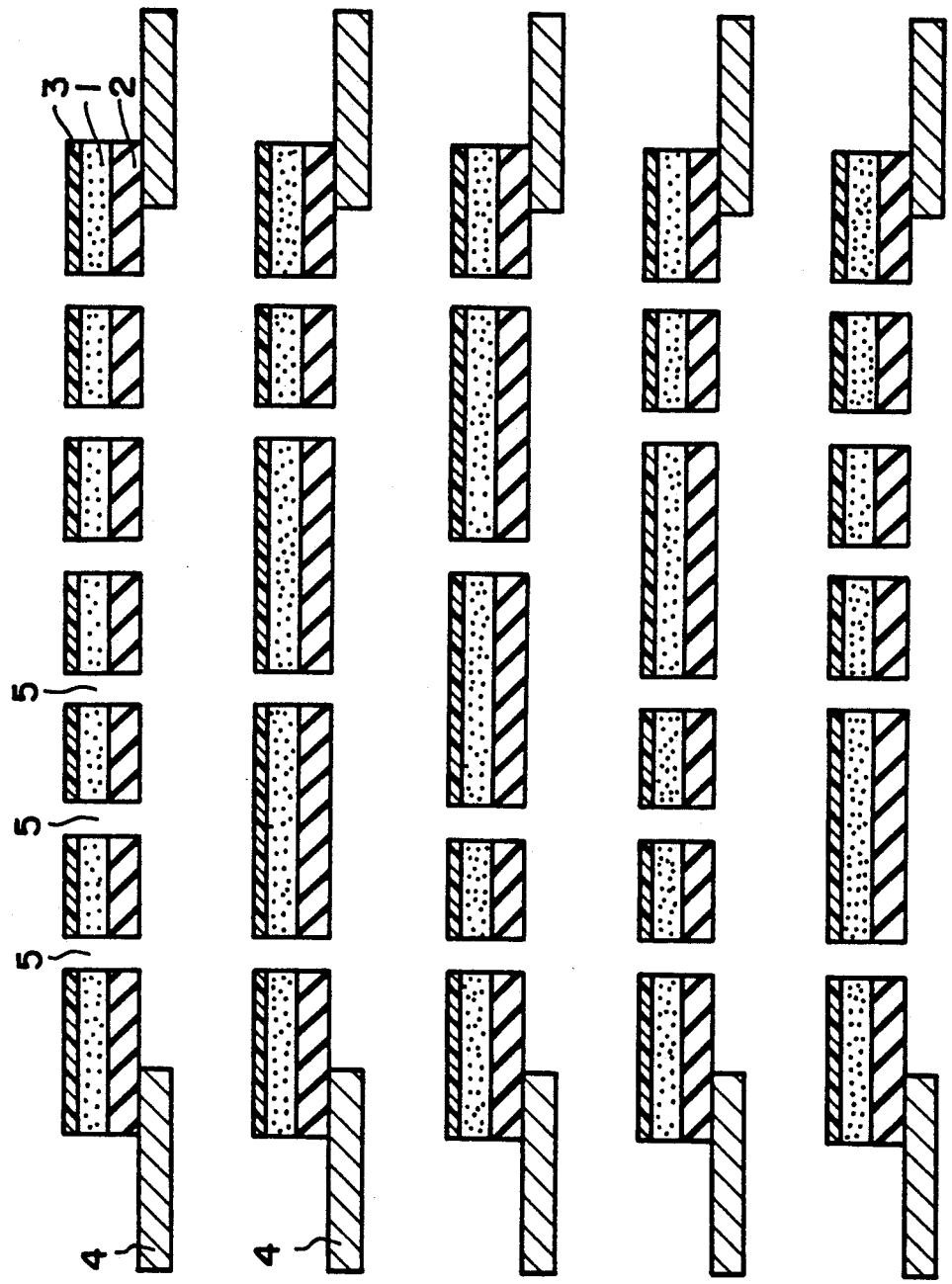
FIG. 4 is a sectional view showing a state in which a through-hole is formed all through the ceramic greensheet, the carrier film and the organic resin film shown in FIG. 3.

FIG. 4 is a sectional view which shows that a through-hole 5 is formed through the ceramic greensheet 1 in the state in which the carrier film 2 and the organic resin film 3 bonded on the surface thereof remain on the ceramic greensheet 1 with the carrier film 2 being fixed to the frame 4. The diameter of the through-hole for use as an interconnection through-hole within the substrate may be 50–200 μm and that for use as a power supply through-hole may be 200–400 μm.

Figure 5:
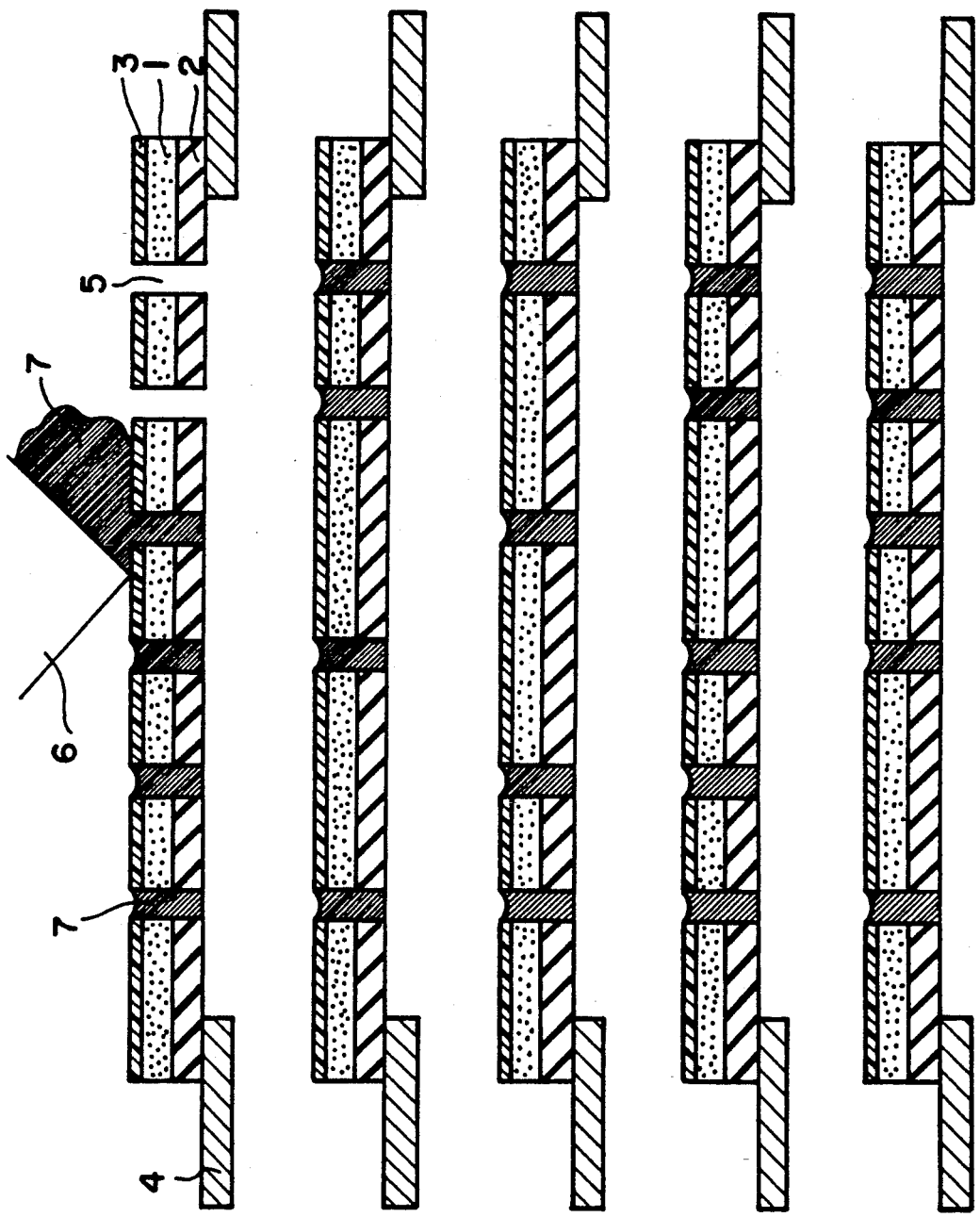
FIG. 5 is a sectional view showing a state in which conductive paste is filled in the through-hole shown in FIG. 4.

FIG. 5 shows a state in which the through-hole formed in the ceramic greensheet 1 is filled with conductive paste 7 by using the organic resign film 3 as a mask and using a squeegee printing edge 6. When the organic resin film 3 is used as the mask in this way, it is possible to omit the conventional step of preparing a metal mask for each through-hole pattern. However, it is to be noted that, since the mask used is not a mask prepared based on a particular designing data, the formation of any incorrectly positioned through-hole cannot be discovered during this process. Thus, it is necessary to make precise and thorough inspections of the positions of the holes after they are formed.

The conductive paste used for filling may be gold, silver, silver-palladium, copper, tungsten, molybdenum, etc. and the viscosity of the paste may be 300–500 kcps.

Figure 6:
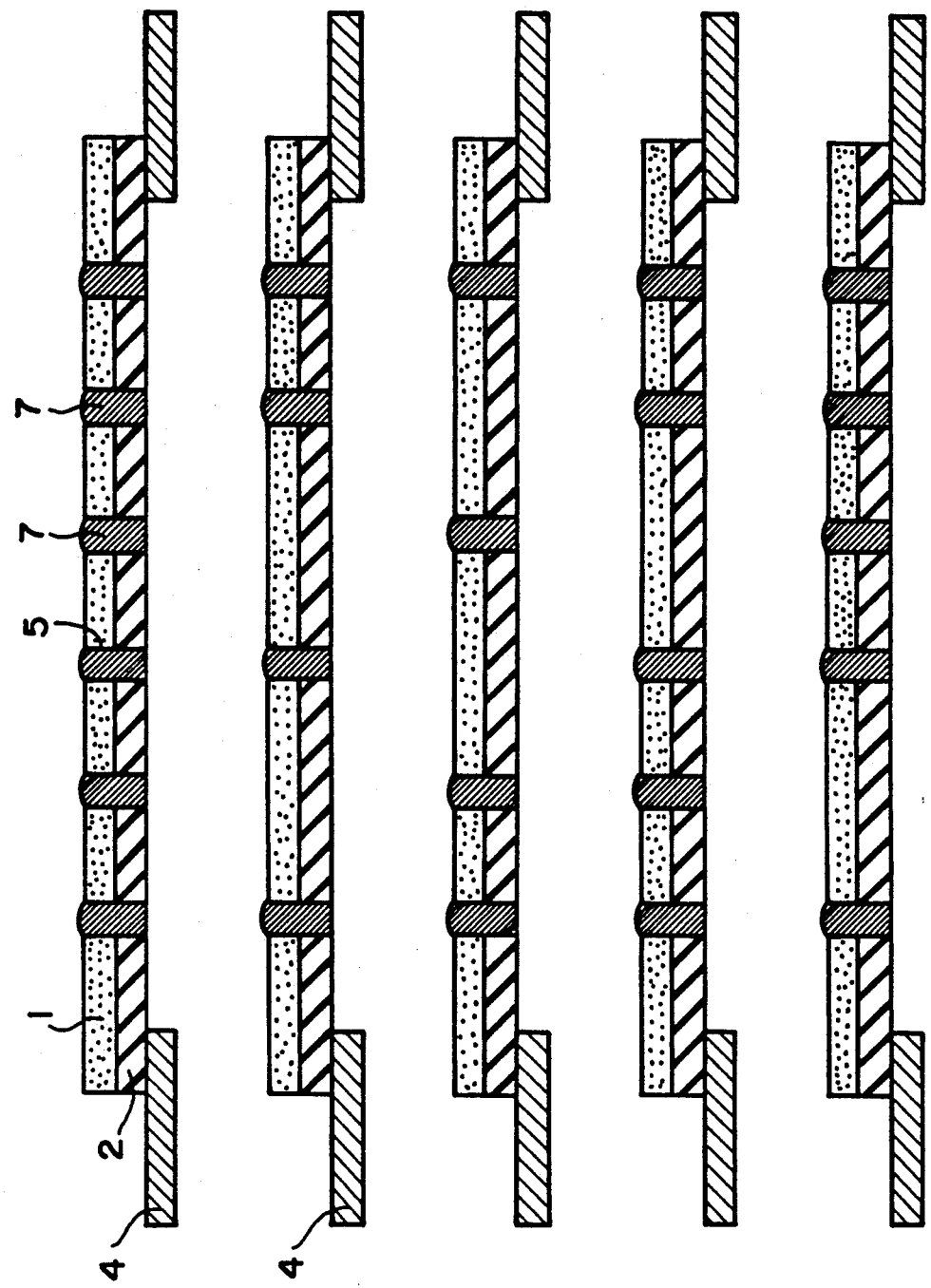
FIG. 6 is a sectional view showing a state in which the organic resin film is removed from the greensheet shown in FIG. 5.

FIG. 6 shows in sectional view a state in which the organic resin film 3 used as the mask during the via-filling has been removed from the surface of the ceramic greensheet 1 and in which the surface of the ceramic greensheet 1 is exposed.

Figure 7:
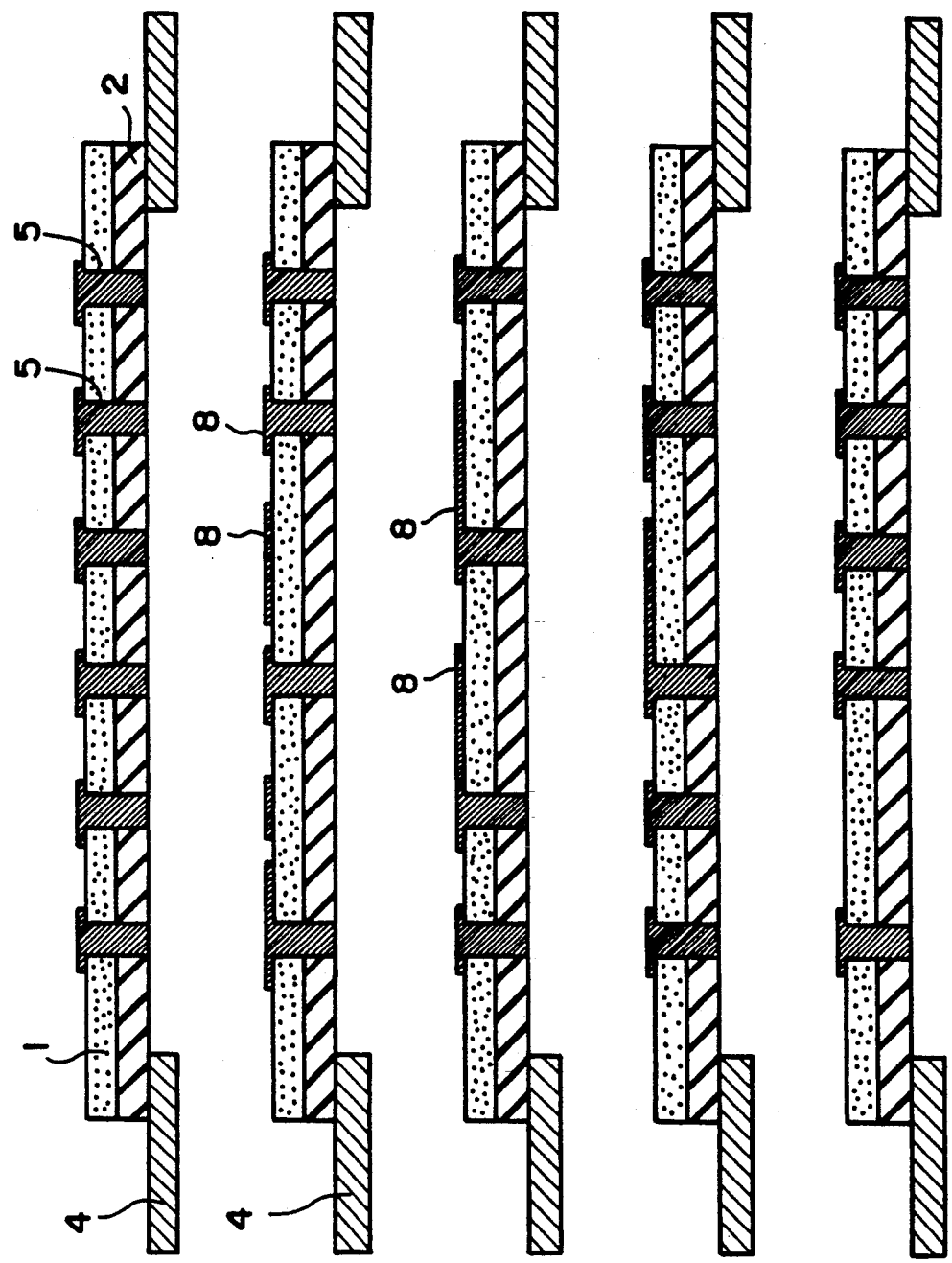
FIG. 7 is a sectional view showing a state in which a conductive pattern is formed on the greensheet shown in FIG. 6.

FIG. 7 shows in sectional view a state in which a conductive pattern 8 is formed on the exposed surface of the greensheet 1 by a screen printing method. The conductive paste is of the same material as that for the through-hole and the viscosity thereof is 100–250 kcps. The screen used is, for example, 325 in a mesh size. As to the metalized patterns for signals, the minimum wiring width thereof is 100 μm and the thickness thereof 12 μm (after drying).

FIGS. 8–15 each shows a greensheet laminate assembly in which the ceramic greensheets each provided with the through-hole and the via-fill and conductive pattern printing in the manner as explained above are stacked one on top of another in a laminating metal die 10.

Figure 8:
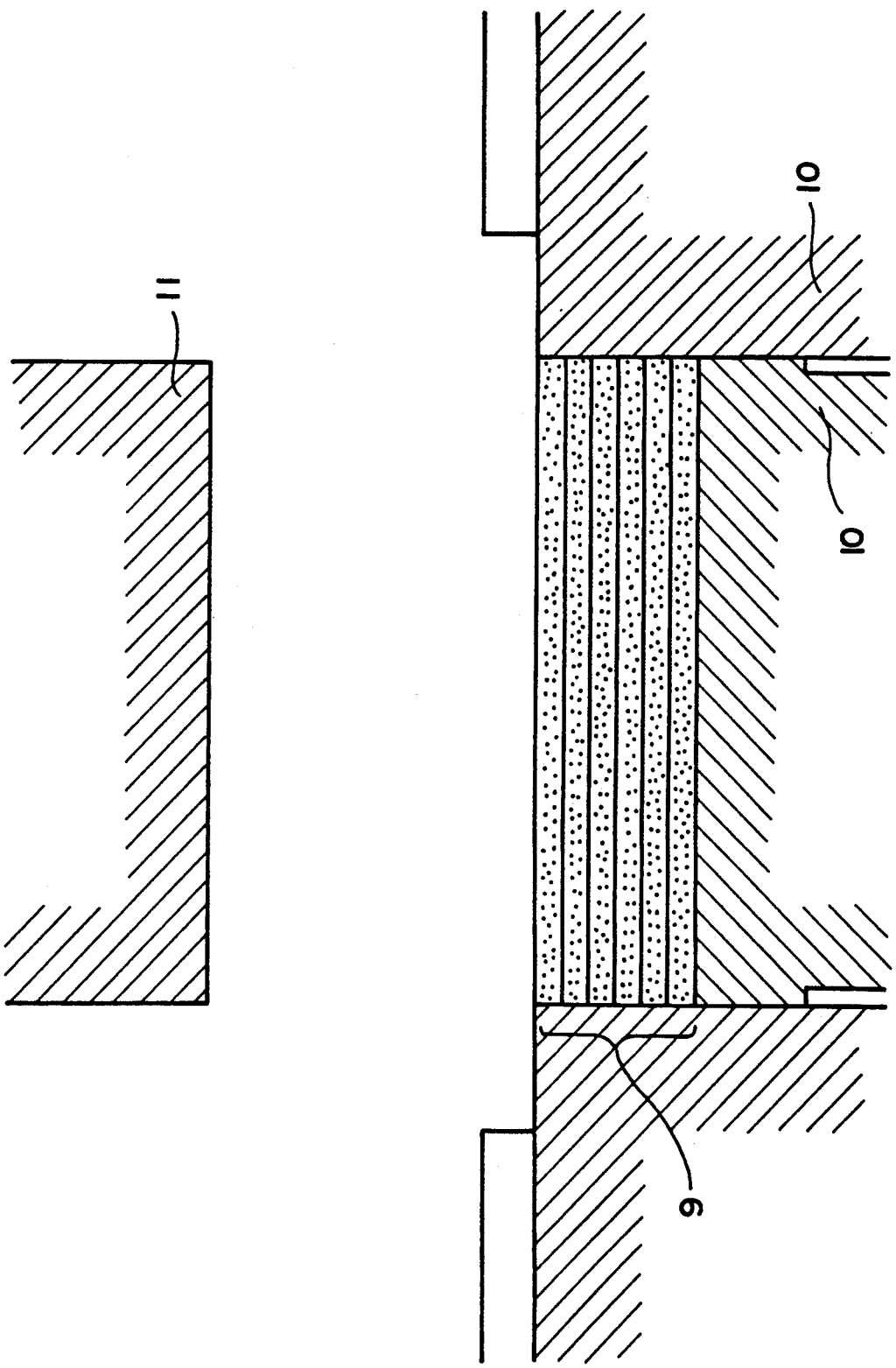
FIG. 8 is a sectional view of a laminate base in a metal die.

Here, as shown in FIG. 8, solid ceramic greensheets are stacked in advance in the lower metal die 10, which become a base 9. The base 9 is unmovably held in the lower metal die 10 by the vacuum created through holes provided at peripheral portions in the lower metal die 10 or by the bond lightly applied to the base.

Figure 9:
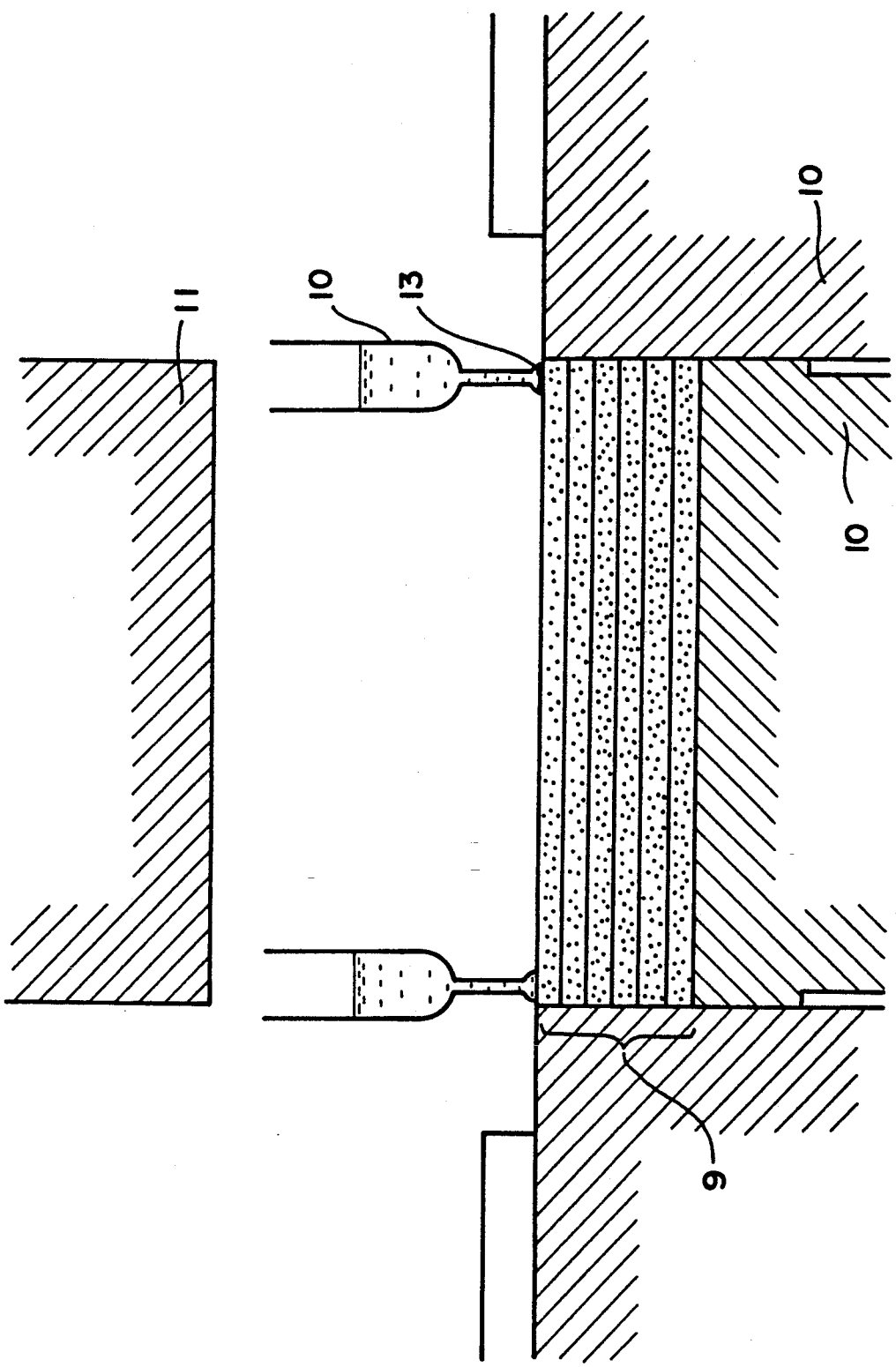
FIG. 9 is a sectional view showing a state in which an organic solvent is applied to peripheries of the base shown in FIG. 8.

The procedures for the lamination include, as shown in FIG. 9, the application of an organic solvent 13 on peripheral portions of the base 9 by using a dispenser 12. This organic solvent has properties of reaction with the binder of the ceramic greensheet for having it bonded to a further ceramic greensheet to be stacked thereon.

Figure 10:
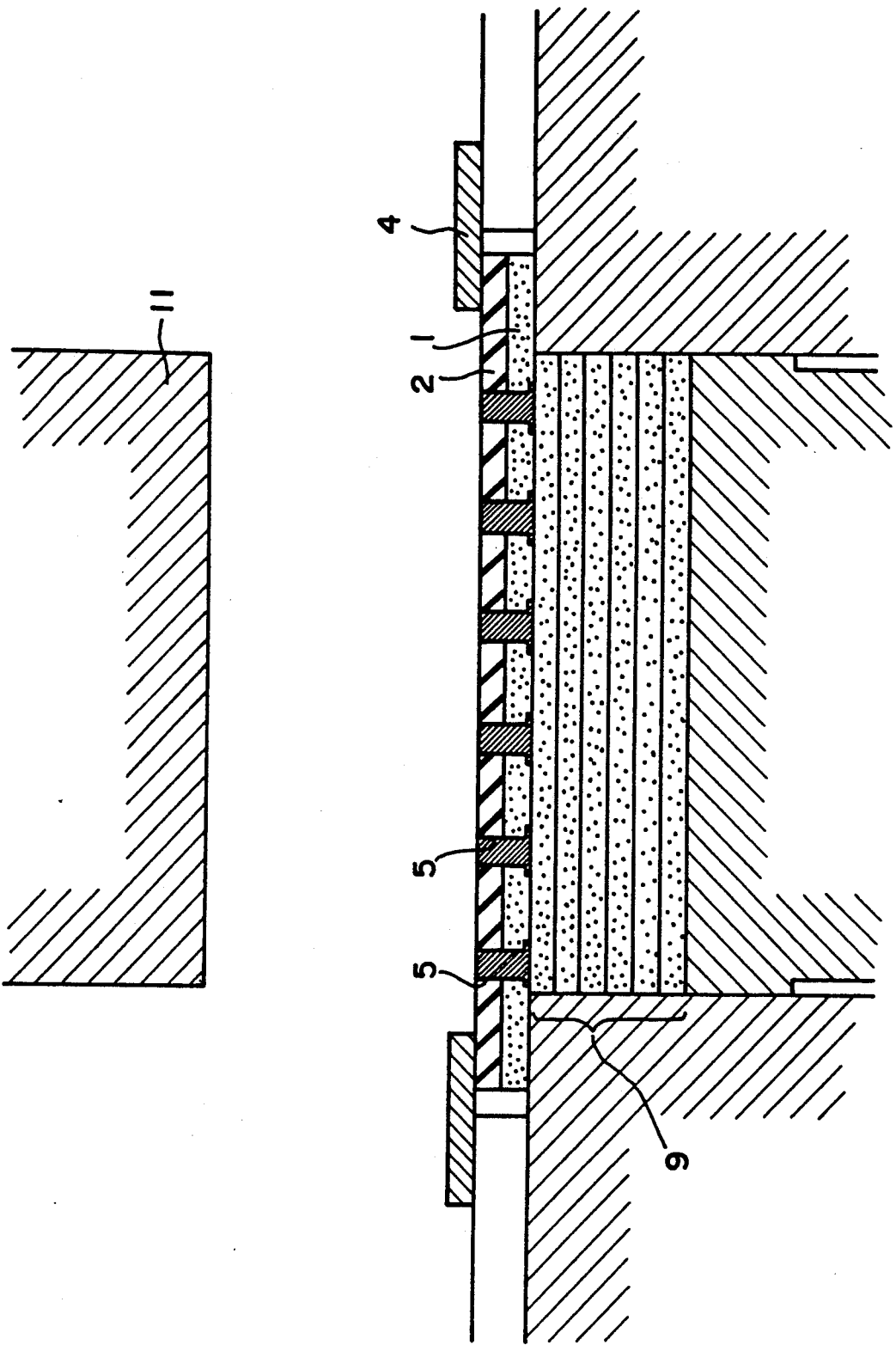
FIG. 10 is a sectional view showing a state in which the ceramic greensheet shown in FIG. 7 is positioned in alignment with the base shown in FIG. 9.
Figure 11:
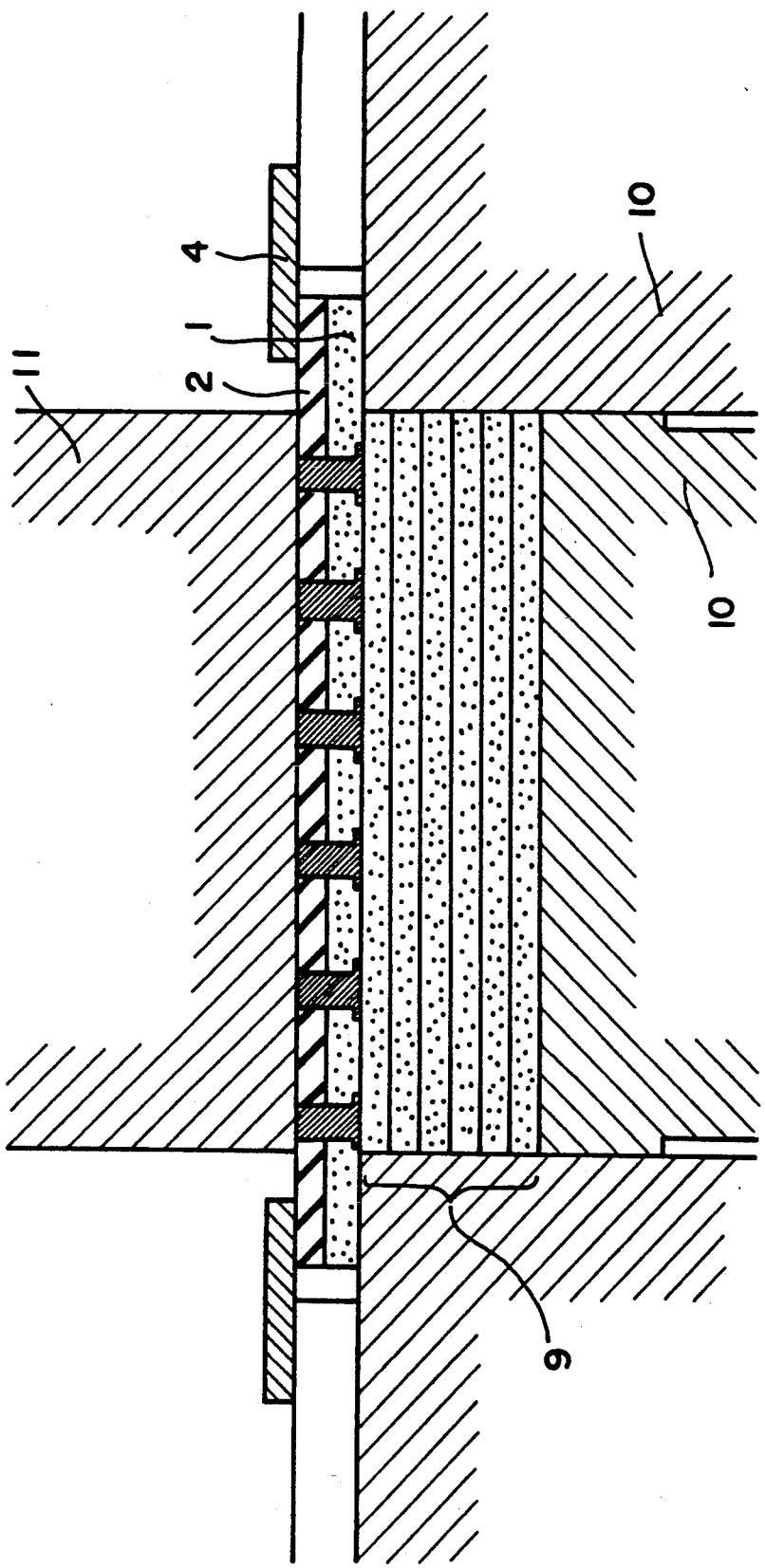
FIG. 11 is a sectional view showing a state in which the base shown in FIG. 10 and the ceramic greensheet are bonded together.

FIG. 10 shows a state in which the ceramic greensheet 1 is aligned and set on the base 9 and FIG. 11 shows a state in which both of them are pressed together by a punch 11. In this process, the greensheets stacked one on top of another in the metal die 10 are provisionally caused to be adhered to one another at peripheries of such greensheets themselves and they are maintained in an unmovable state. Alternative methods for achieving the provisional adherence of the greensheets themselves may include a method in which atomized organic solvents are applied on overall surfaces of greensheets which are then stacked together and a method in which between the respective greensheets is inserted a sheet which is thermally dissolvable during the sintering process and which has adherence properties.

Figure 12:
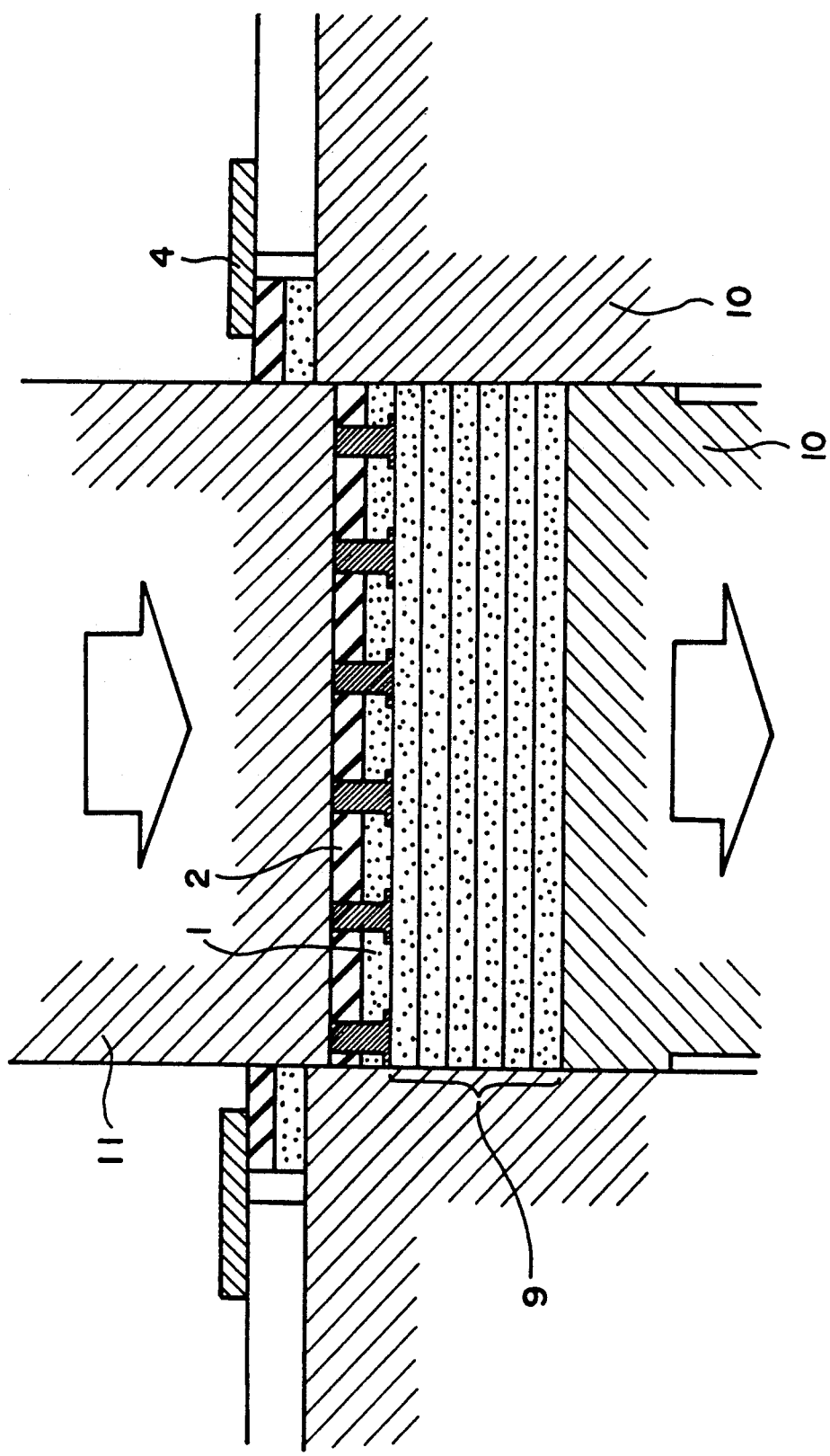
FIG. 12 is a sectional view showing a state in which the ceramic greensheet shown in FIG. 11 is being cut by the metal die and an upper punch.
Figure 13:
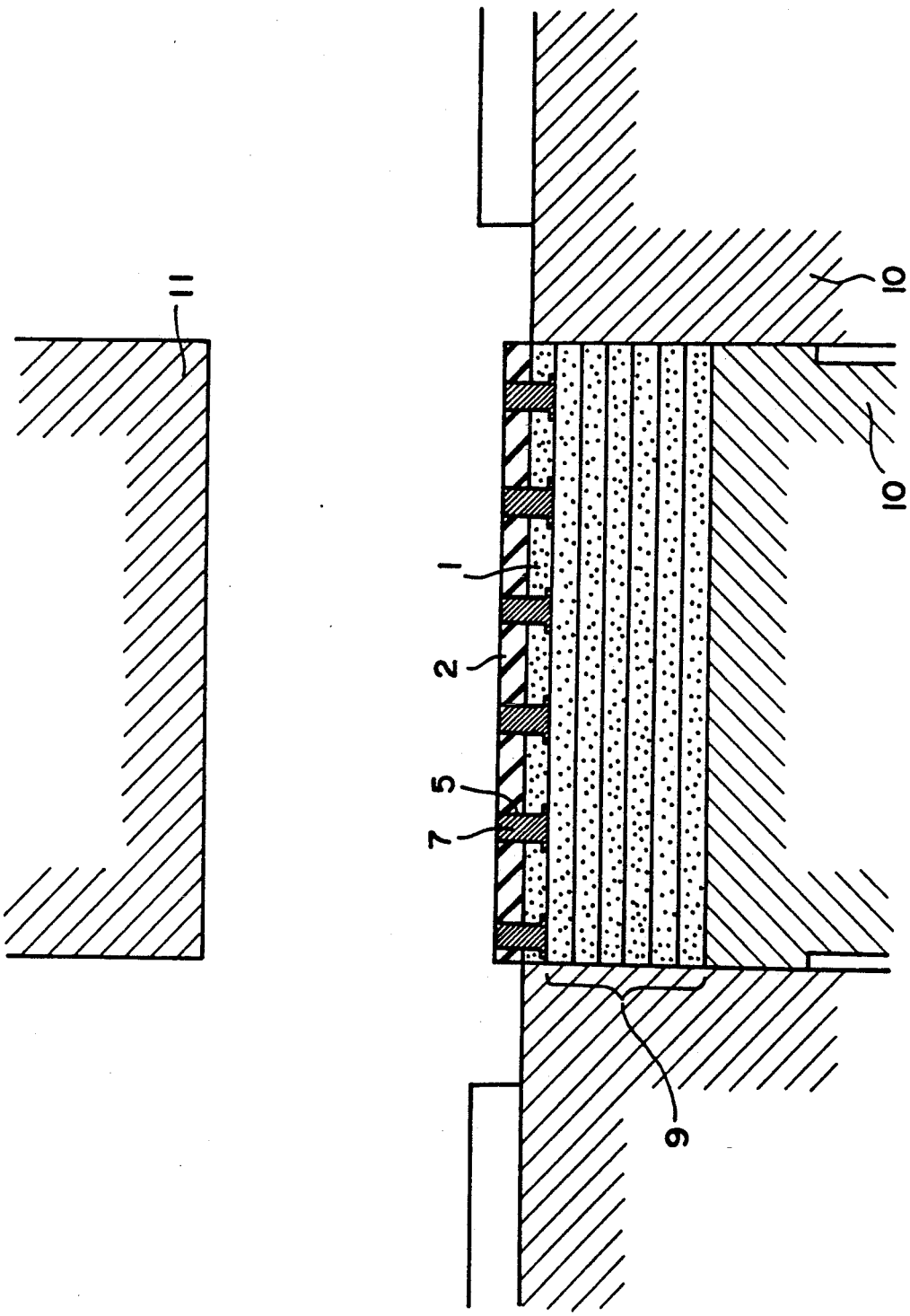
FIG. 13 is a sectional view showing a state in which the cutting of the ceramic greensheet as shown in FIG. 12 has been completed.
Figure 14:
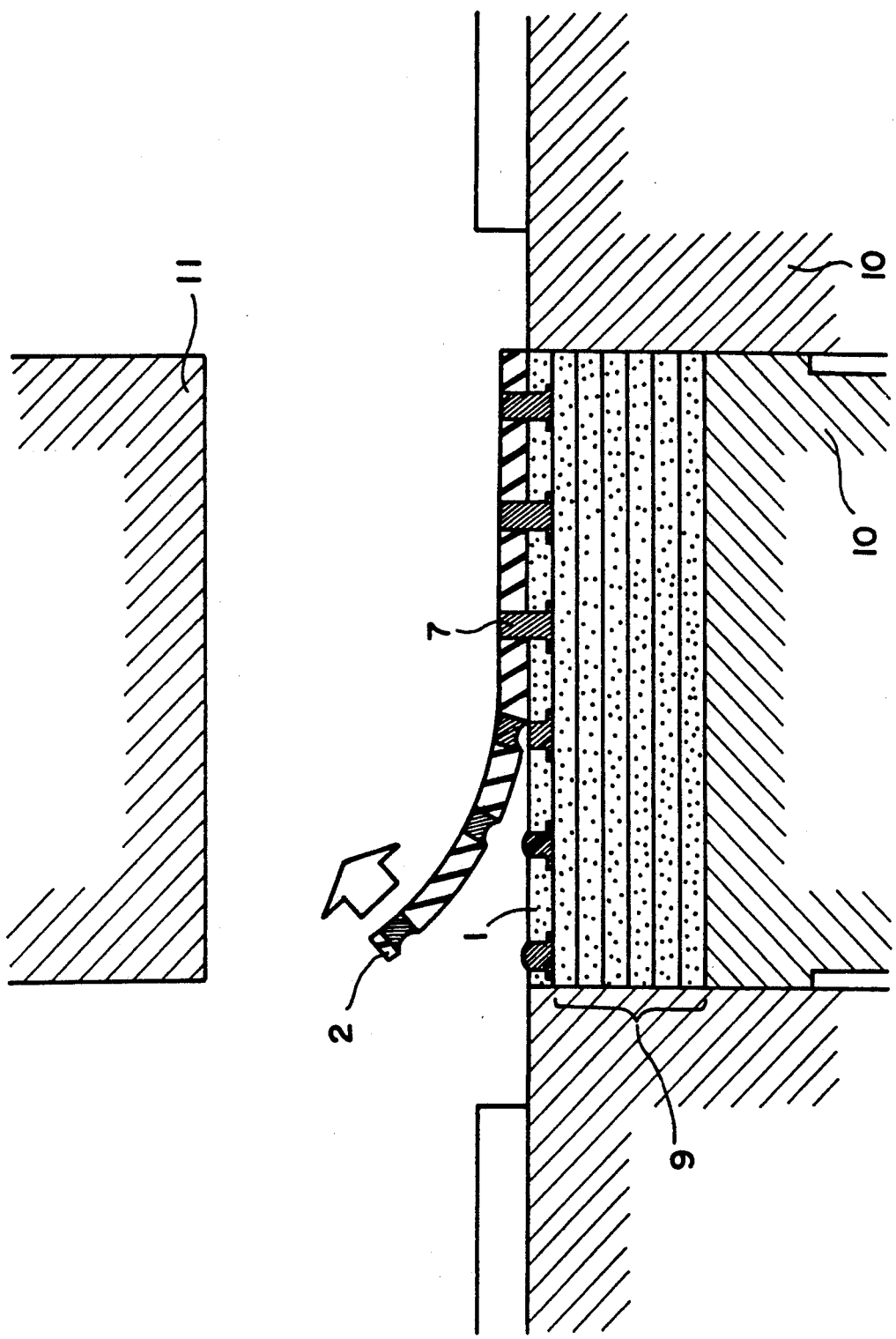
FIG. 14 is a sectional view showing a state in which the carrier film is being removed from the ceramic greensheet shown in FIG. 13.

Subsequently, as shown in FIGS. 12 and 13, the ceramic greensheet and the carrier film 2 together are cut by the metal die 10 and the punch 11. Then, as shown in FIGS. 14 and 15, the carrier film 2 on the greensheet 1 is removed. For further lamination of layers, the steps as illustrated by FIGS. 8–15 are repeated.

Figure 16:
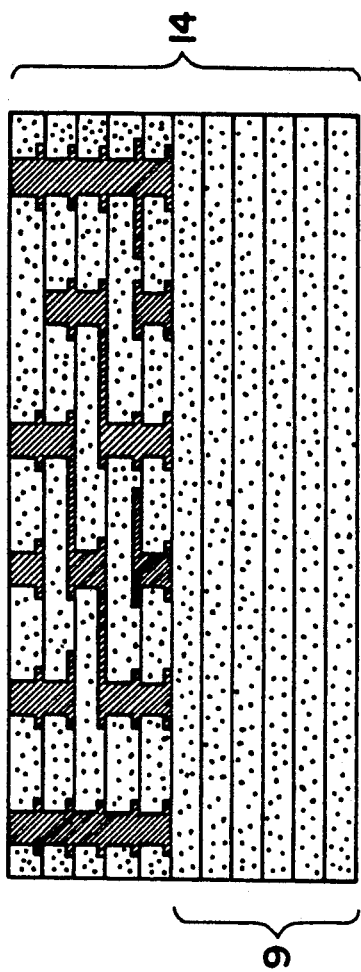
FIG. 16 is a sectional view of the ceramic greensheet assembly fabricated after repeating the process steps illustrated in FIGS. 8–15.

In the manner as explained above, the laminate provisionally adhered at the peripheral portions of the base is prepared first so that the ceramic greensheets themselves are kept in an unmovable state and such laminate is subjected to thermal adhesion using a press, which results in the ceramic greensheet assembly 14 as shown in FIG. 16. The condition for effecting the thermal adhesion includes, for example, a temperature of 110° C. and a pressure of 180 kg/cm$^2$.

Figure 17:
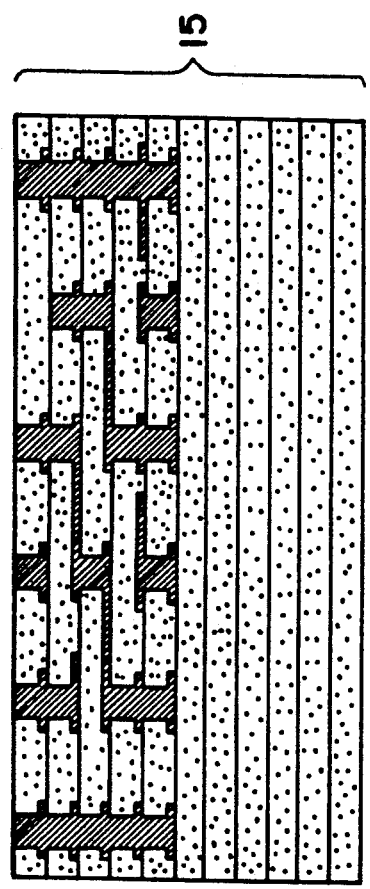
FIG. 17 is a sectional view of a sintered ceramic structure formed by sintering the ceramic greensheet laminate assembly shown in FIG. 16.
Figure 18:
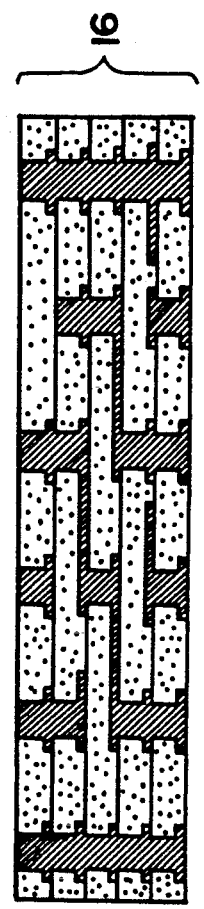
FIG. 18 is a sectional view of the ceramic multi-layer substrate in which the base portion of the sintered ceramic structure shown in FIG. 17 is removed from the structure.

FIG. 17 is a sectional view of the sintered ceramic structure 15 formed after the removal of binder and the sintering of the assembly. Here, due to the sintering, there is a contraction in the order of 10–15% in the base. The base is removed by a grinding process, whereby the through-holes are exposed. This provides the ceramic multi-layer substrate 16 as shown in FIG. 18.

FIGS. 19–29 are diagrammatic sectional views of a ceramic multi-layer substrate of a second embodiment according to the invention for explanation of the fabrication steps thereof.

In the same manner as shown in FIG. 1, a ceramic greensheet 1 is cast on a carrier film 2 by using a doctor blade technology. In this case, the thickness of the greensheet may be 100 μm and that of the carrier film may be 100 μm.

Figure 19:
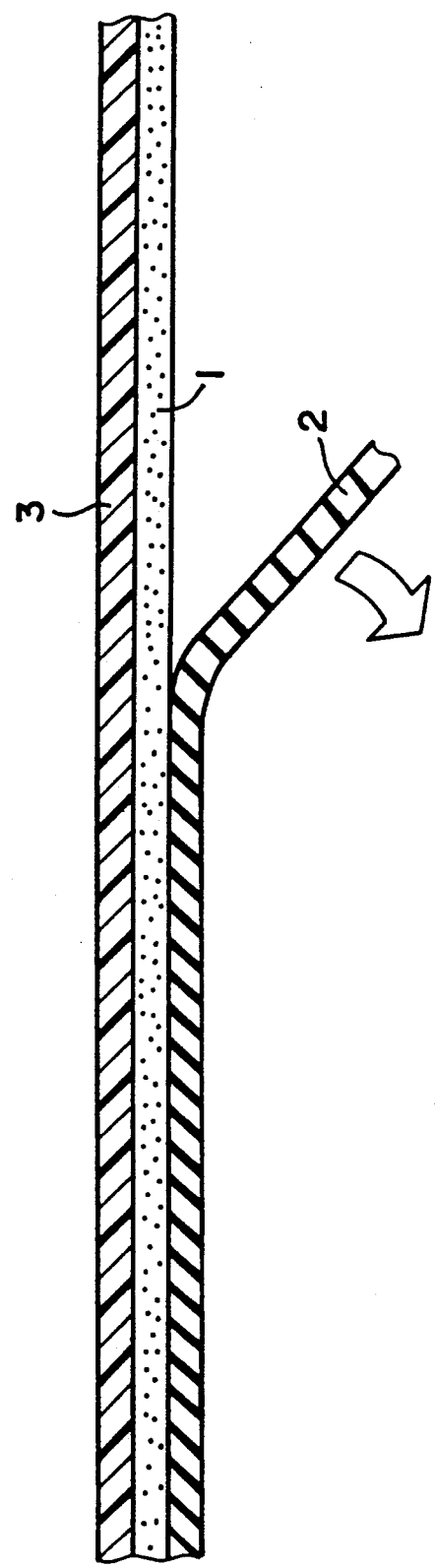

FIG. 19 is a diagrammatic sectional view of a structure in which the cast ceramic greensheet 1 on which an organic resin film 3 is fixed or bonded is being removed from a carrier film 2. This organic resin film 3 bonded on the greensheet 1 serves to suppress the changes in dimensions of the ceramic greensheet 1 caused by the subsequent processes. The organic resin film may be 30–100 μm thick and, as the material therefor, oriented polypropylene and polyethylene in addition to polyester may be considered appropriate.

Figure 20:
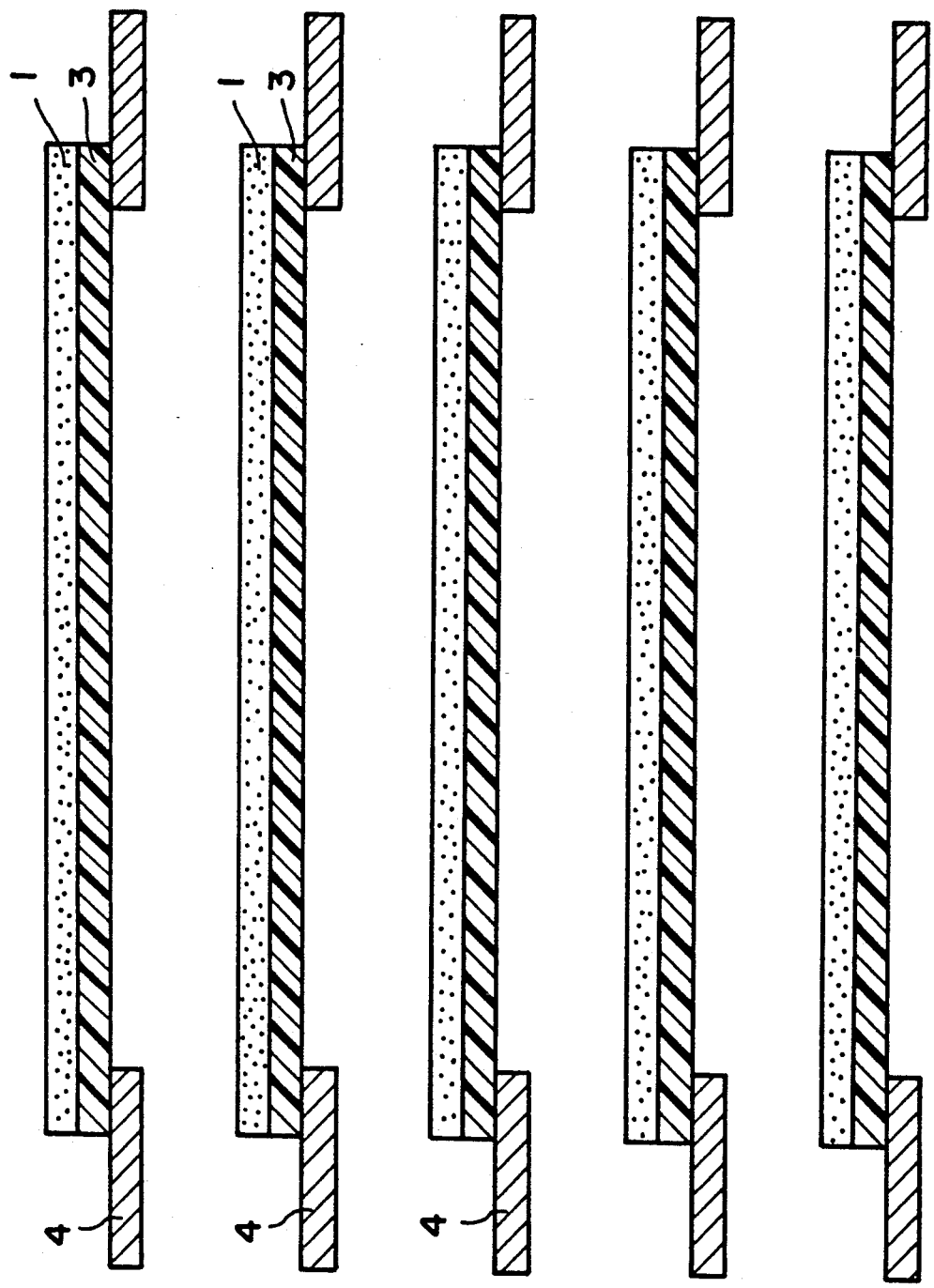

FIG. 20 shows a state in which the ceramic greensheet 1 together with the organic resin film 3 is cut into individual greensheets of a desired size and the peripheral portions of each of the individual organic resin film 3 are fixed to a frame 4 for process-handling by adhesive. In this case, the greensheet is supported by the organic resin film 3 but whether the greensheet carrying the carrier film or the carrier film carrying the greensheet is bonded to the frame 4 is a choice which may be made in consideration of the overall processes.

Figure 21:
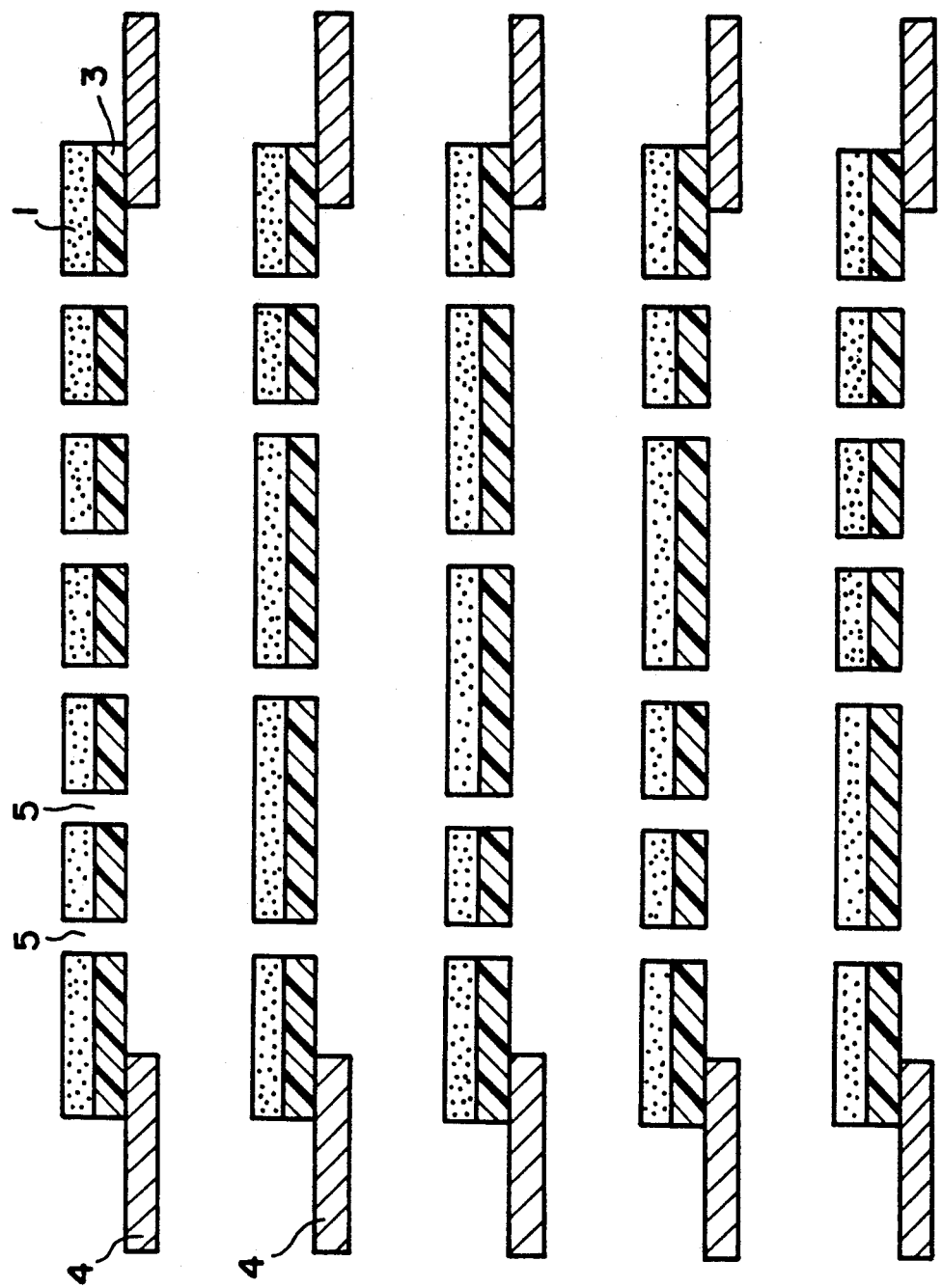

FIG. 21 is a sectional view which shows that a through-hole 5 is formed through the ceramic greensheet 1 fixed to the frame 4 and the organic resin film 3 bonded on the surface thereof. The diameter of the through-hole for use as an interconnection through-hole within the substrate may be 50–200 μm and that for use as a power supply through-hole may be 200–400 μm.

Figure 22:
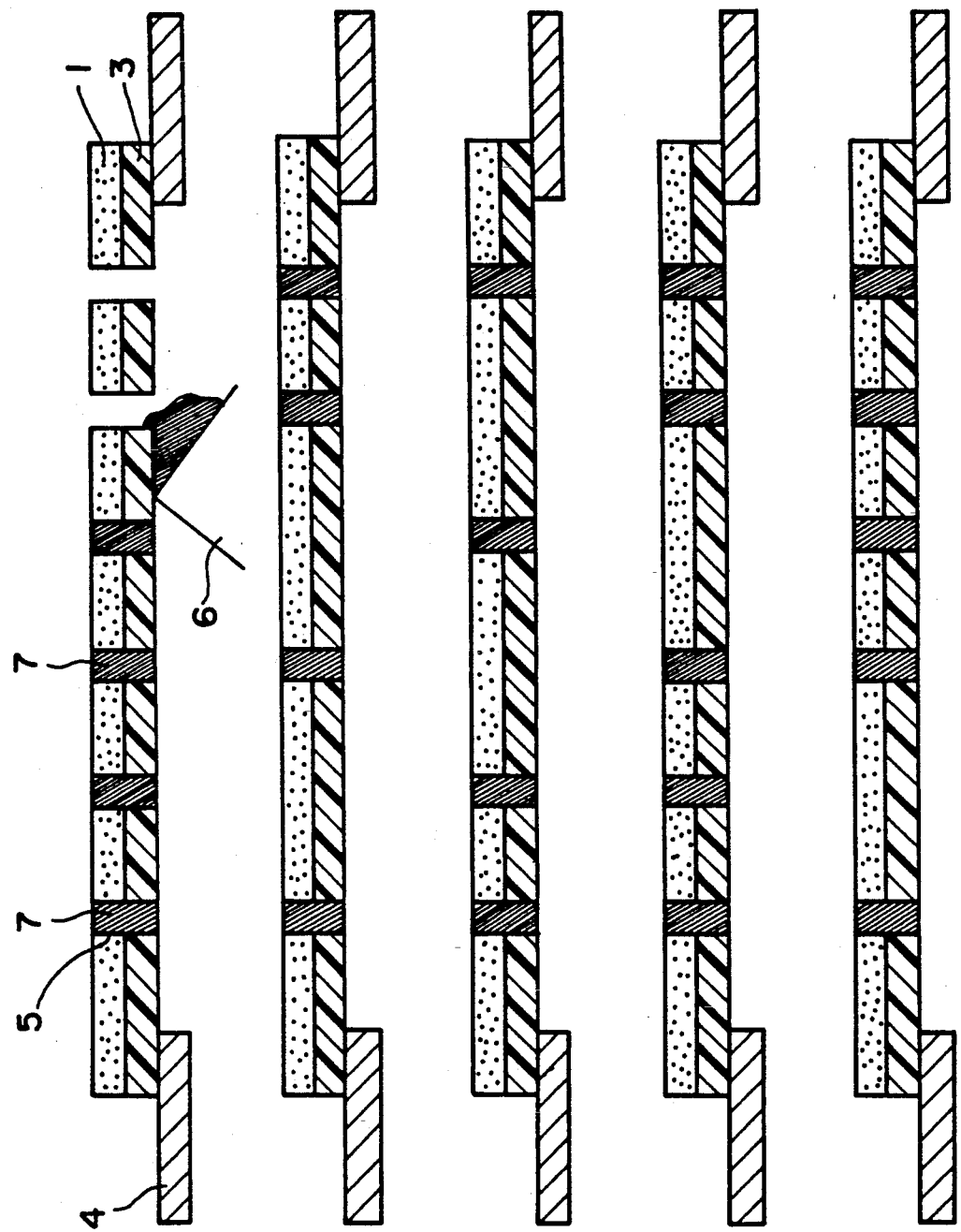

FIG. 22 shows a state in which the through-hole formed in the ceramic greensheet 1 is filled with conductive paste by using the organic resin film 3 as a mask and using a squeegee printing edge 6. When the organic resin film 3 is used as the mask in this way, it is possible to omit the conventional step of preparing a metal mask for each through-hole pattern.

Figure 23:
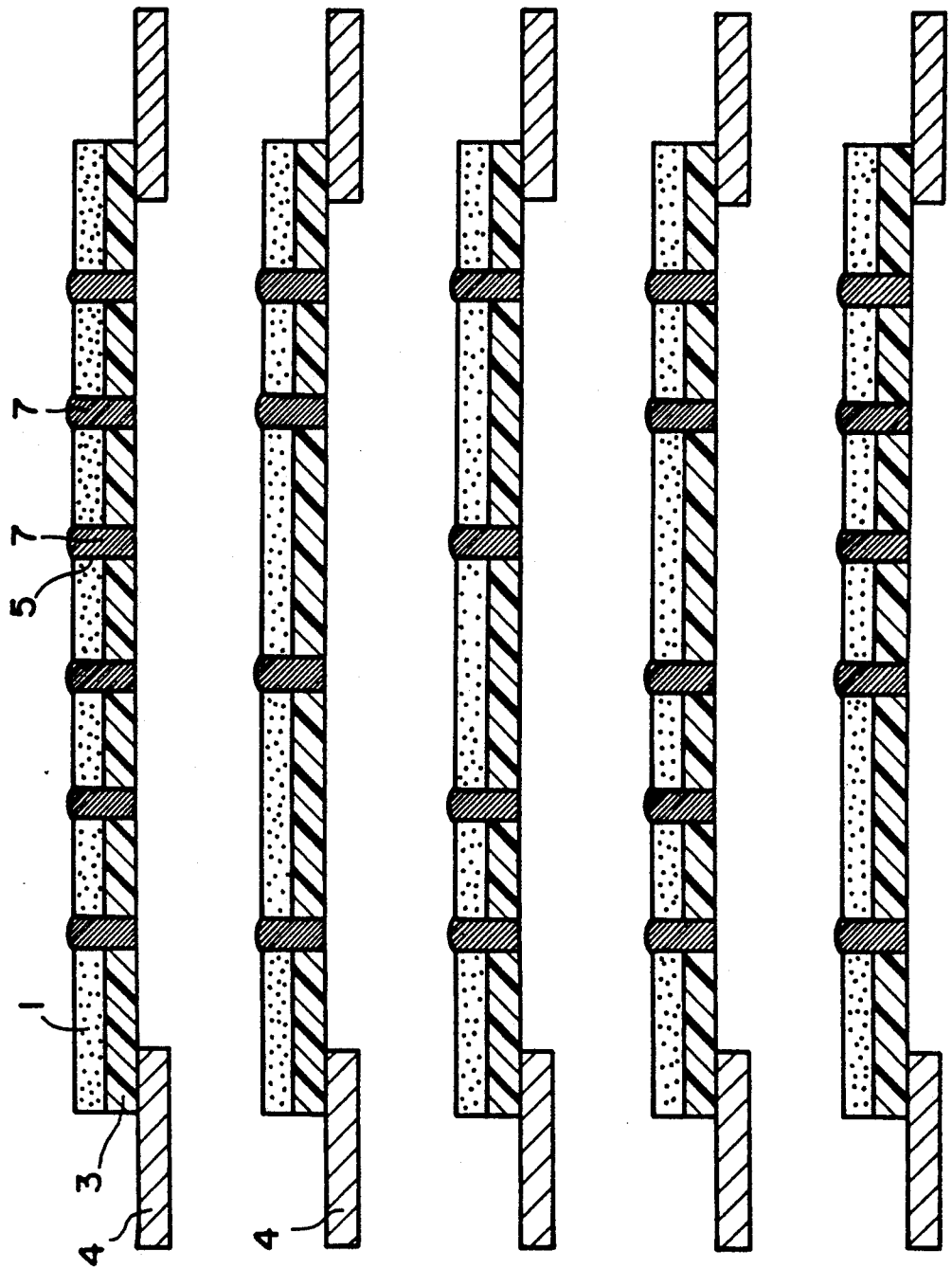

FIG. 23 shows in sectional view a state in which the conductive paste 5 is filled in the through-holes of the greensheet to which the organic resin film 3 is bonded.

Figure 24:
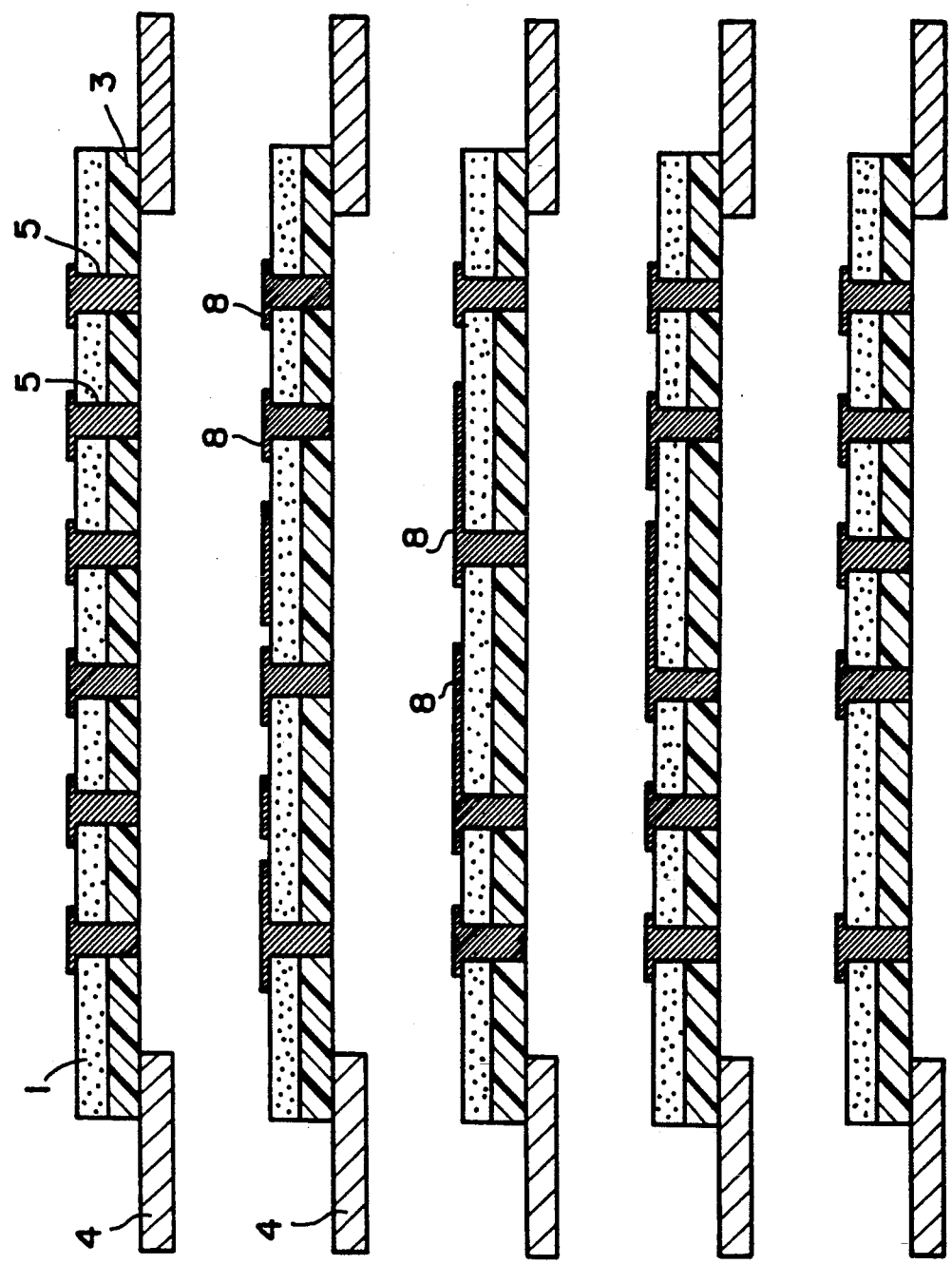

FIG. 24 shows in sectional view a state in which a conductive pattern 8 is formed on the surface of the greensheet 1 by a screen printing method.

FIGS. 25-29 each shows a greensheet laminate assembly in which the ceramic greensheets each provided with the through-hole and the via-fill and conductive pattern printing in the manner as explained above are stacked one on top of another in a laminating metal die 10.

Here, as shown in FIG. 8, solid ceramic greensheets are stacked in advance in a lower metal die, which become a base 9. The base 9 is unmovably kept at the bottom of the metal die by the vaccum created through holes provided at peripheral portions of the bottom or by the bond lightly applied to the base.

The procedures for the lamination include, as shown in FIG. 9, the application of an organic solvent 13 on peripheral portions of the base 9 by using a dispenser 12. This organic solvent has properties of reacting with the binder of the ceramic greensheet for having it bonded to a ceramic greensheet to be laminated thereon.

Figure 25:
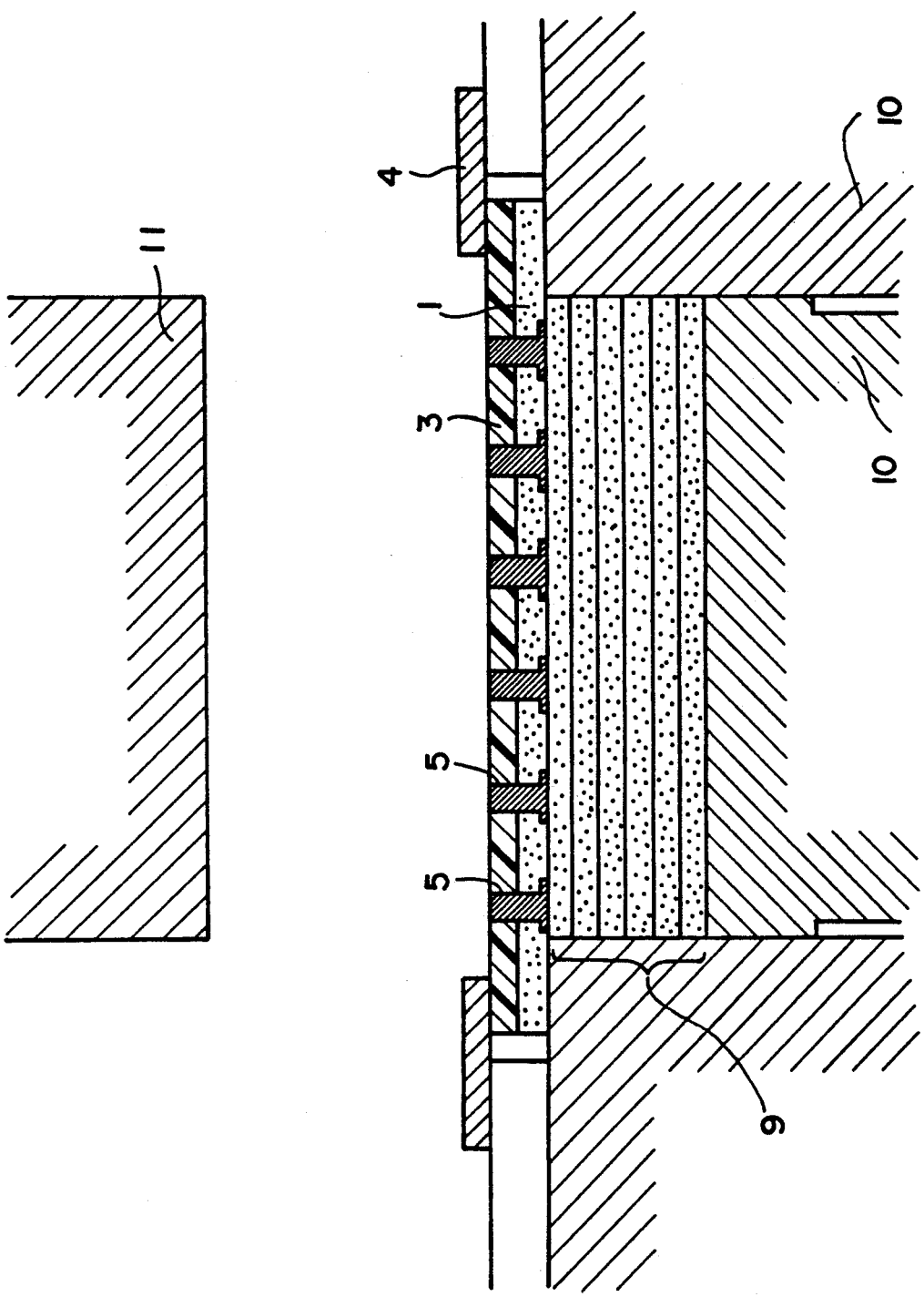
Figure 26:
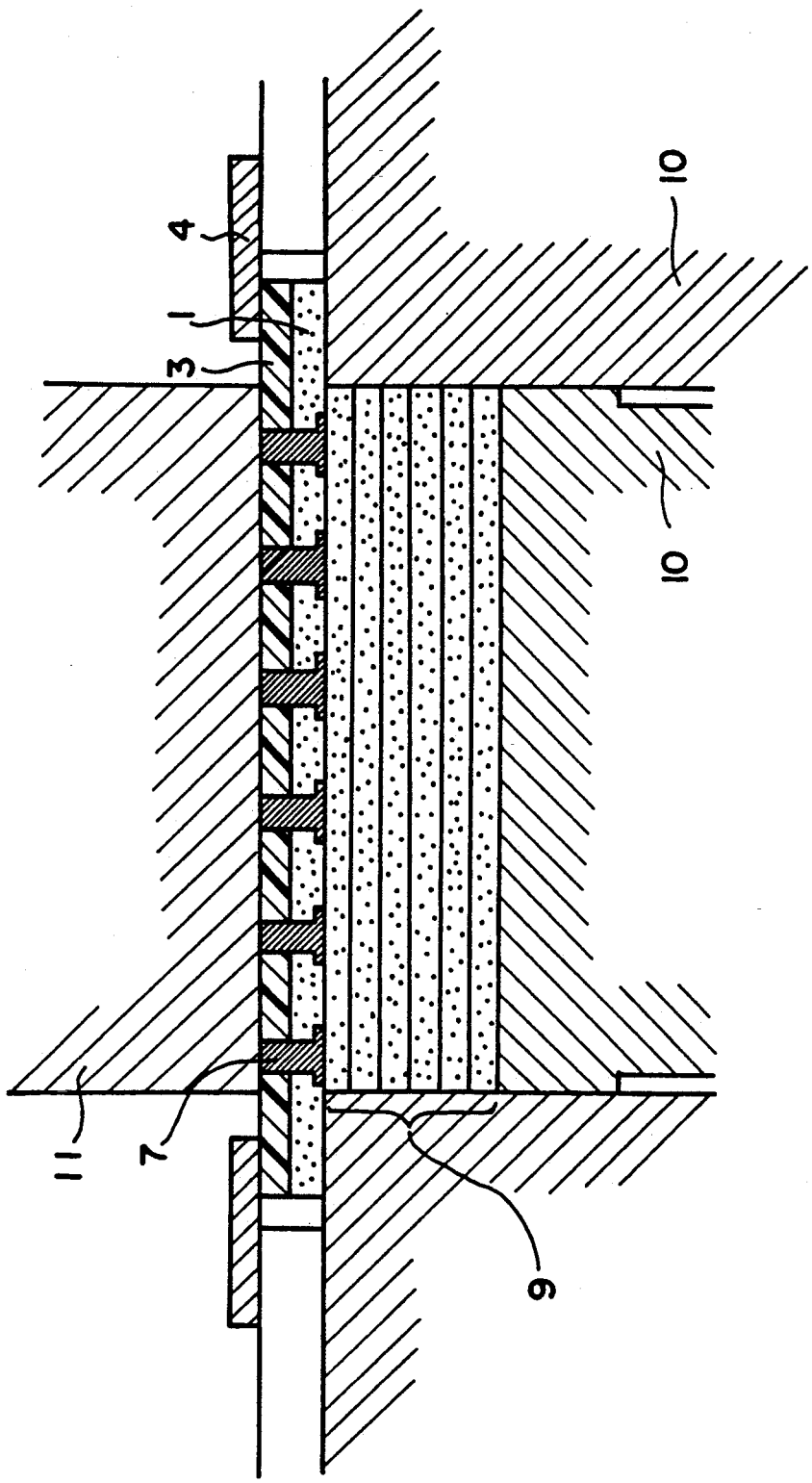

FIG. 25 shows a state in which the ceramic greensheet 1 is a sligned and set on the base 9 and FIG. 26 shows a state in which both of them are pressed together by a punch 11. In this process, the greensheets stacked one on top of another in the metal die 10 are provisionally caused to be adhered to one another at peripheries of such greensheets themselves and they are maintained in an unmovable state. Alternative methods for achieving the provisional adherence of the greensheets themselves may include a method in which atomized organic solvents are applied on overall surfaces of greensheets which are then stacked together and a method in which between the respective greensheets the insertion is made of a sheet which is thermally dissolvable during the sintering process and which has adherence properties.

Figure 27:
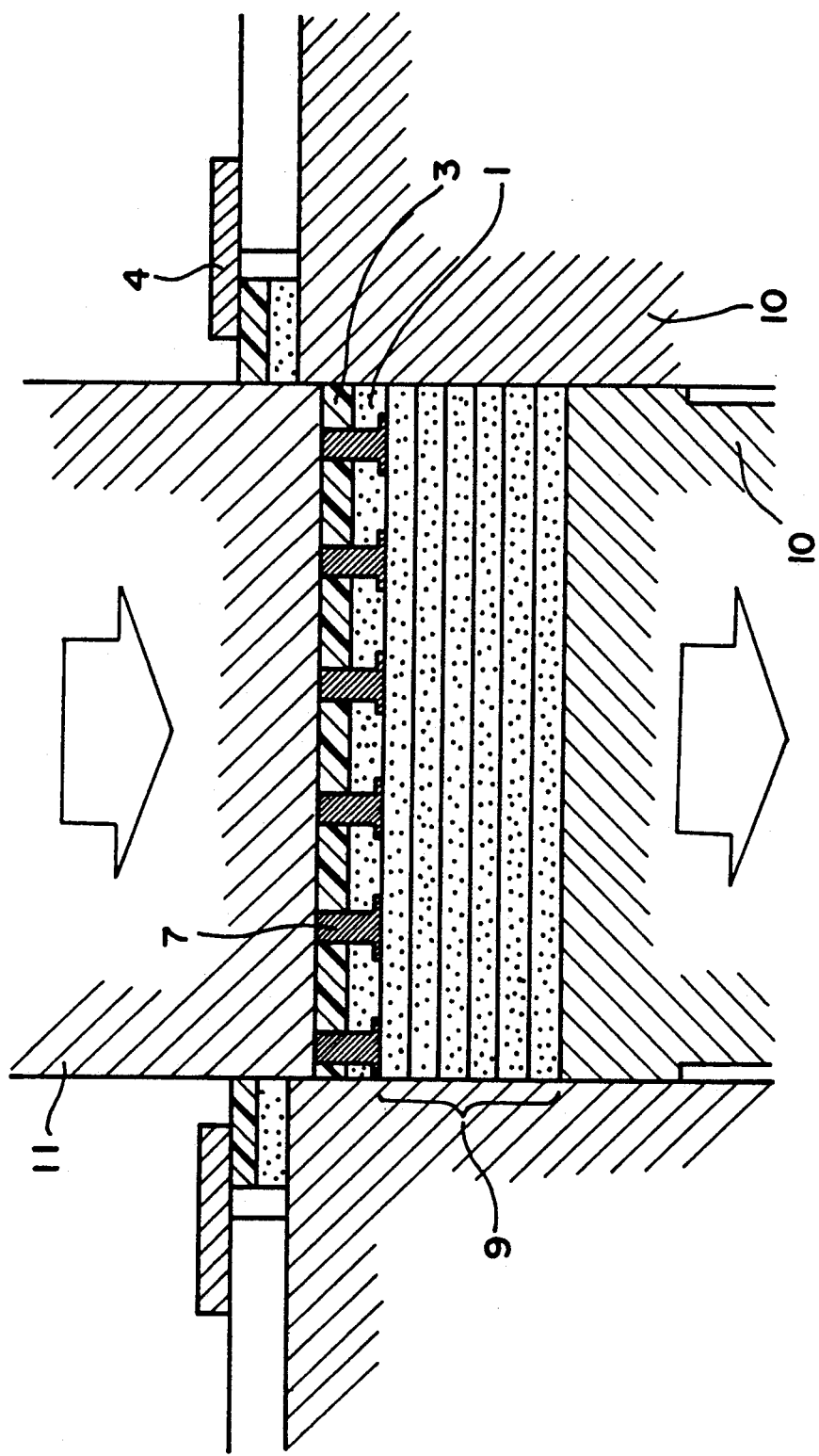
Figure 28:
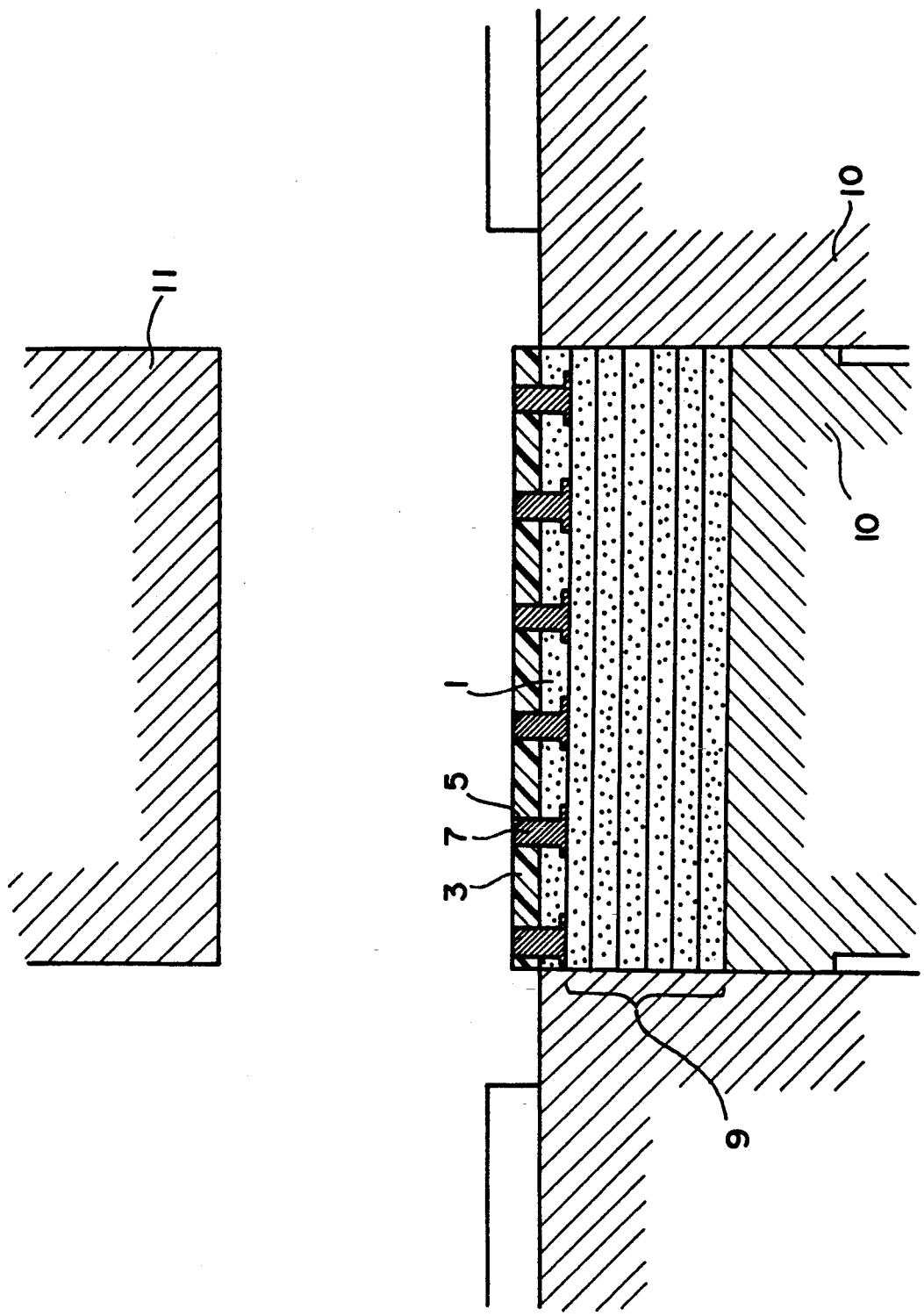
Figure 29:
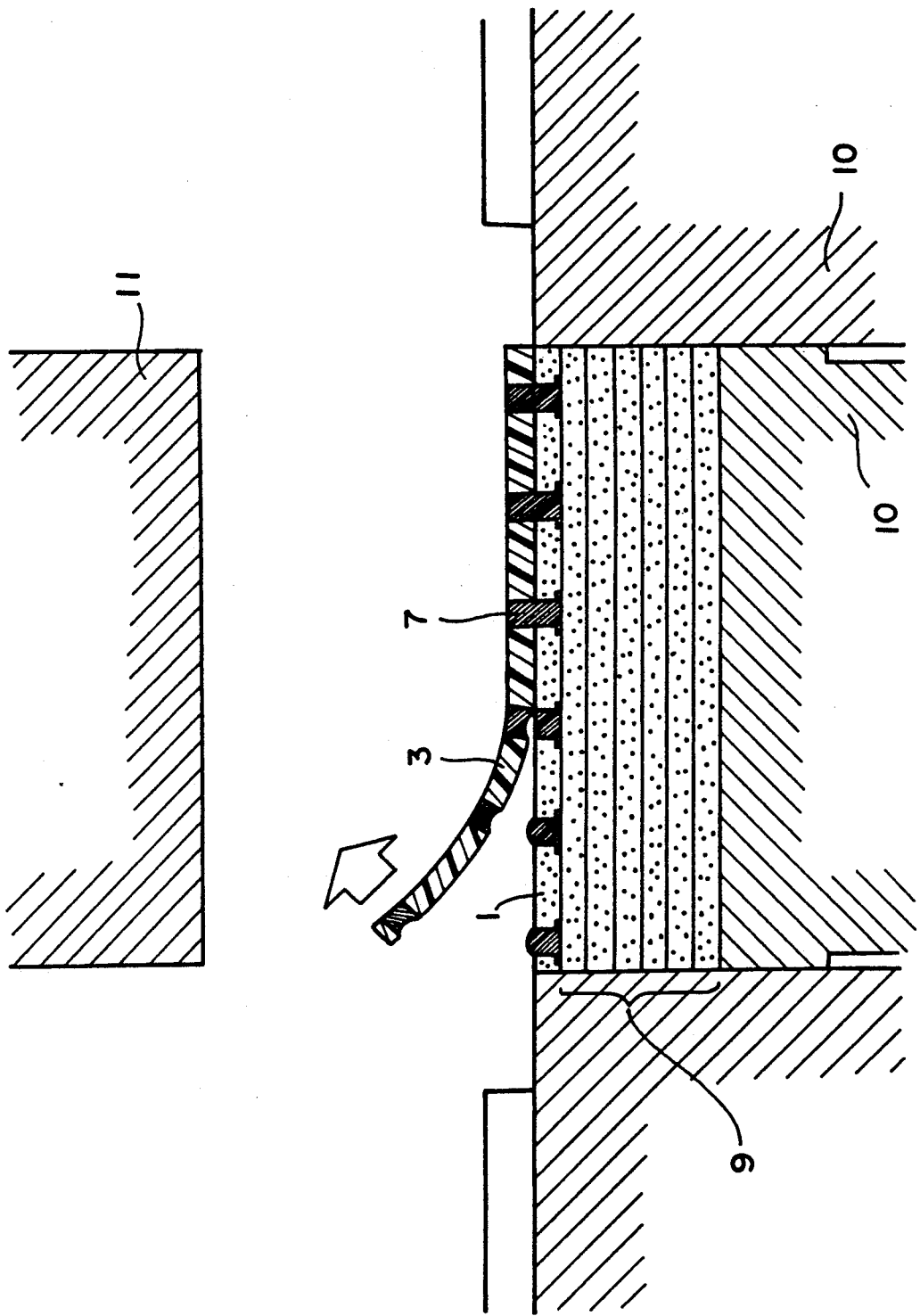

Subsequently, as shown in FIGS. 27 and 28, the ceramic greensheet and the carrier film 2 which carries it are cut together by press. Then, as shown in FIG. 29, the organic resin film 3 carried by the greensheet 1 is removed. For further lamination of layers, the steps as illustrated by FIGS. 25-29 are repeated.

In the manner as explained above, the laminate provisionally adhered at the peripheral portions of the base is prepared first so that the ceramic greensheets themselves are kept in an unmovable state and such laminate is subjected to thermal adhesion by press, which results in the ceramic greensheet assembly 14 as shown in FIG. 16.

Then, the base portion is removed by a grinding process, whereby the through-holes are exposed. This provides the ceramic multi-layer substrate 16 as shown in FIG. 18.

FIGS. 30-40 are diagrammatic sectional views of a ceramic multi-layer substrate of a third embodiment according to the invention for explanation of the fabrication steps thereof.

As shown in FIG. 1, a ceramic greensheet 1 is cast on a carrier film 2 by using a doctor blade technology. In this case, the thickness of the greensheet may be 100 $\mu$m and that of the carrier film may be 100 $\mu$m. The thickness of ceramic greensheet 1 to be cast may be in the order of 50-400 $\mu$m.

Figure 30:
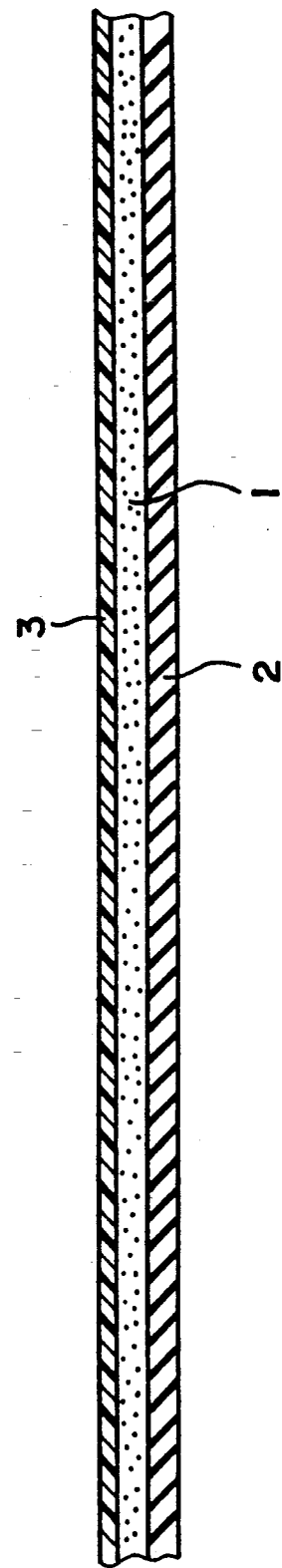

FIG. 30 is a diagrammatic sectional view of a structure in which an organic resin film 3 is fixed or bonded on a surface of the cast ceramic greensheet 1. This organic resin film 3 serves to suppress the changes in dimensions of the ceramic greensheet 1 caused by the subsequent processes. The organic resin film may be 30-100 $\mu$m thick and, as the material therefor, oriented polypropylene and polyethylene in addition to polyester may be considered appropriate.

Figure 31:
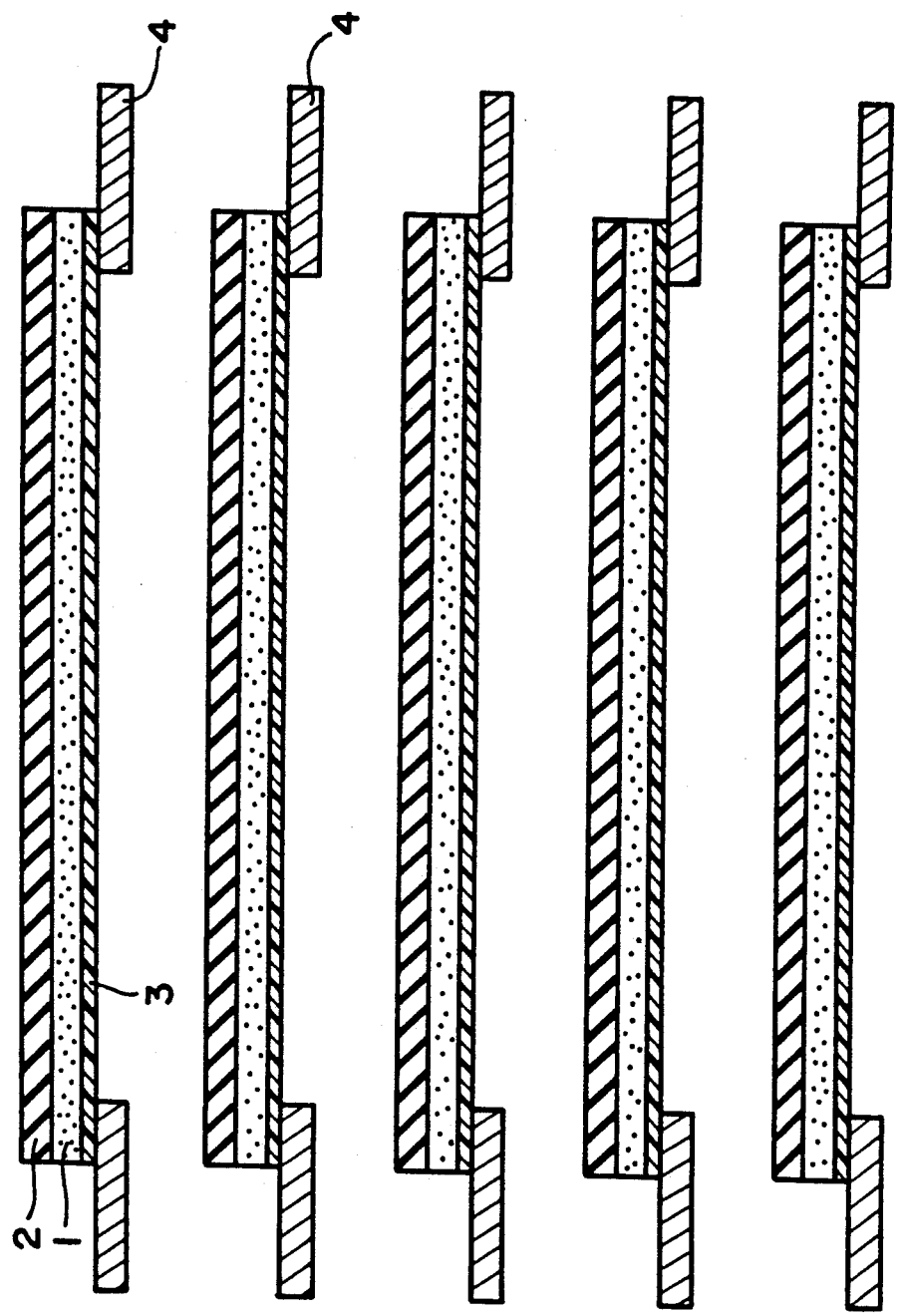

FIG. 31 shows a state in which the ceramic greensheet 1 together with the carrier film 2 and the organic resin film 3 is cut into individual greensheets of a desired size and the peripheral portions of each of the individual organic resin film 3 are fixed to a frame 4 for process-handling by adhesive. In this state, the ceramic greensheet 1 is sandwiched between the carrier film 2 and the organic resin film 3.

The frame 4 is made of, for example, stainless steel and the size thereof which is determined by the size of the substrate to be completed may be 400 mm $\times$ 400 mm and 300 mm $\times$ 300 mm in its outer diameter and inner diameters, respectively, and 1 mm in its thickness. In each step of the remaining processes, the aligning of patterns with pattern references is effected by aligning the positions of the frames 4.

Figure 32:
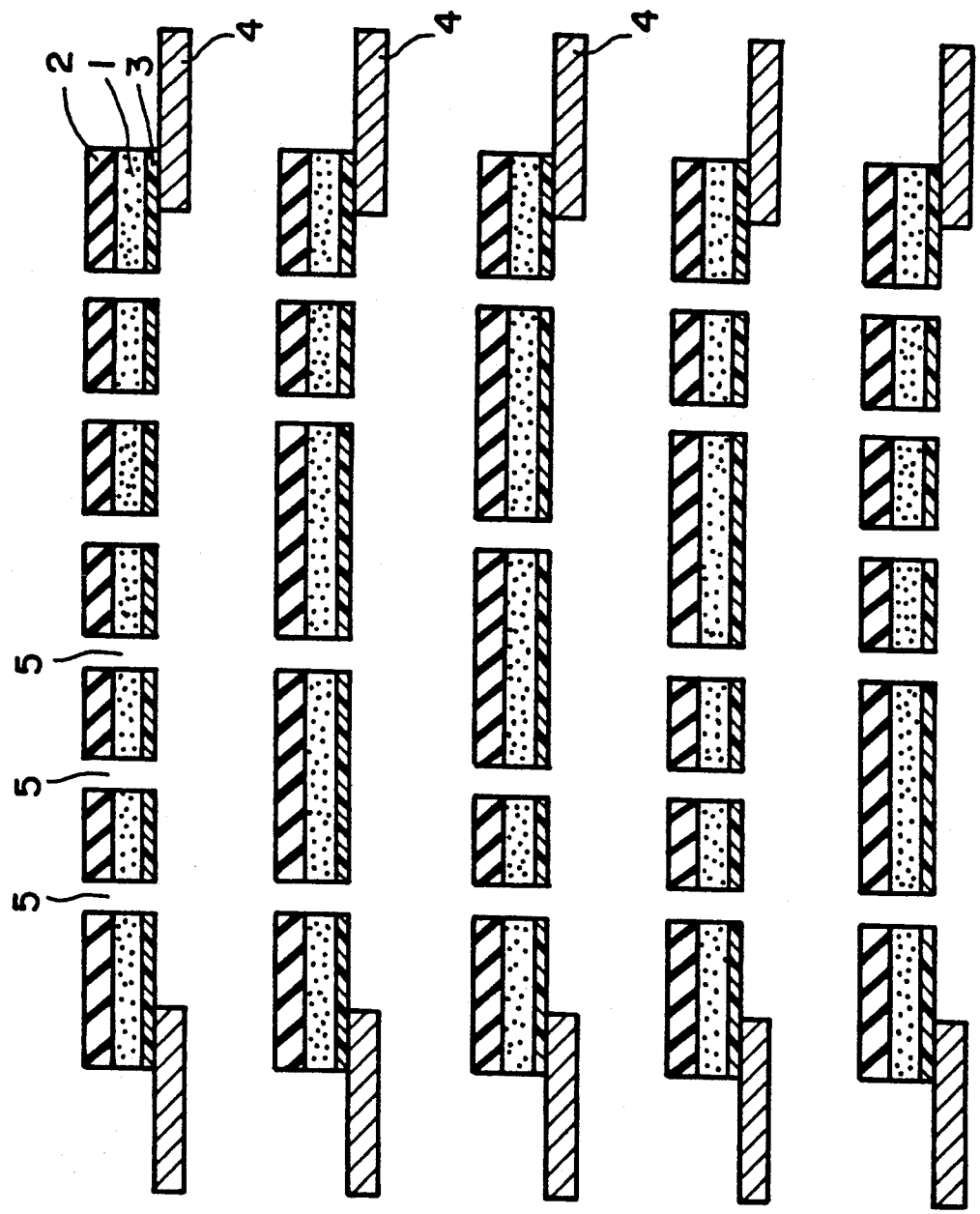

FIG. 32 is a sectional view which shows that a through-hole 5 is formed through the ceramic greensheet 1 fixed to the frame 4 together with the carrier film 2 and the organic resin film 3 bonded thereon. The diameter of the through-hole for use as an interconnection through-hole within the substrate may be 50-200 $\mu$m and that for use as a power supply through-hole may be 200-400 $\mu$m.

Figure 33:
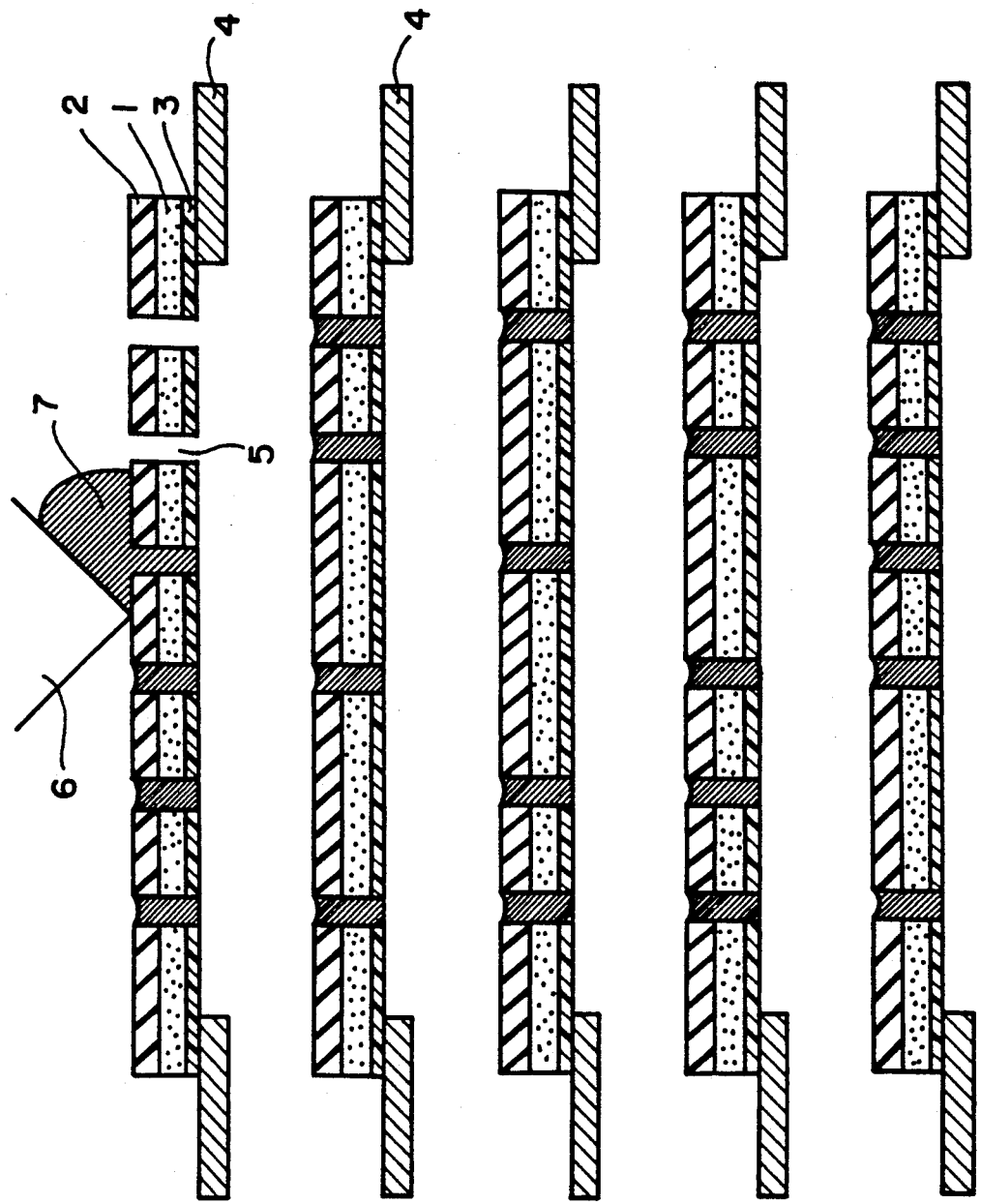

FIG. 33 shows a state in which the through-hole formed in the ceramic greensheet 1 is filled with conductive paste 7 by using the carrier film 2 as a mask and using a squeegee printing edge 6. When the carrier film 2 is used as the mask in this way, it is possible to omit the conventional step of preparing a metal mask for each through-hole pattern.

Figure 34:
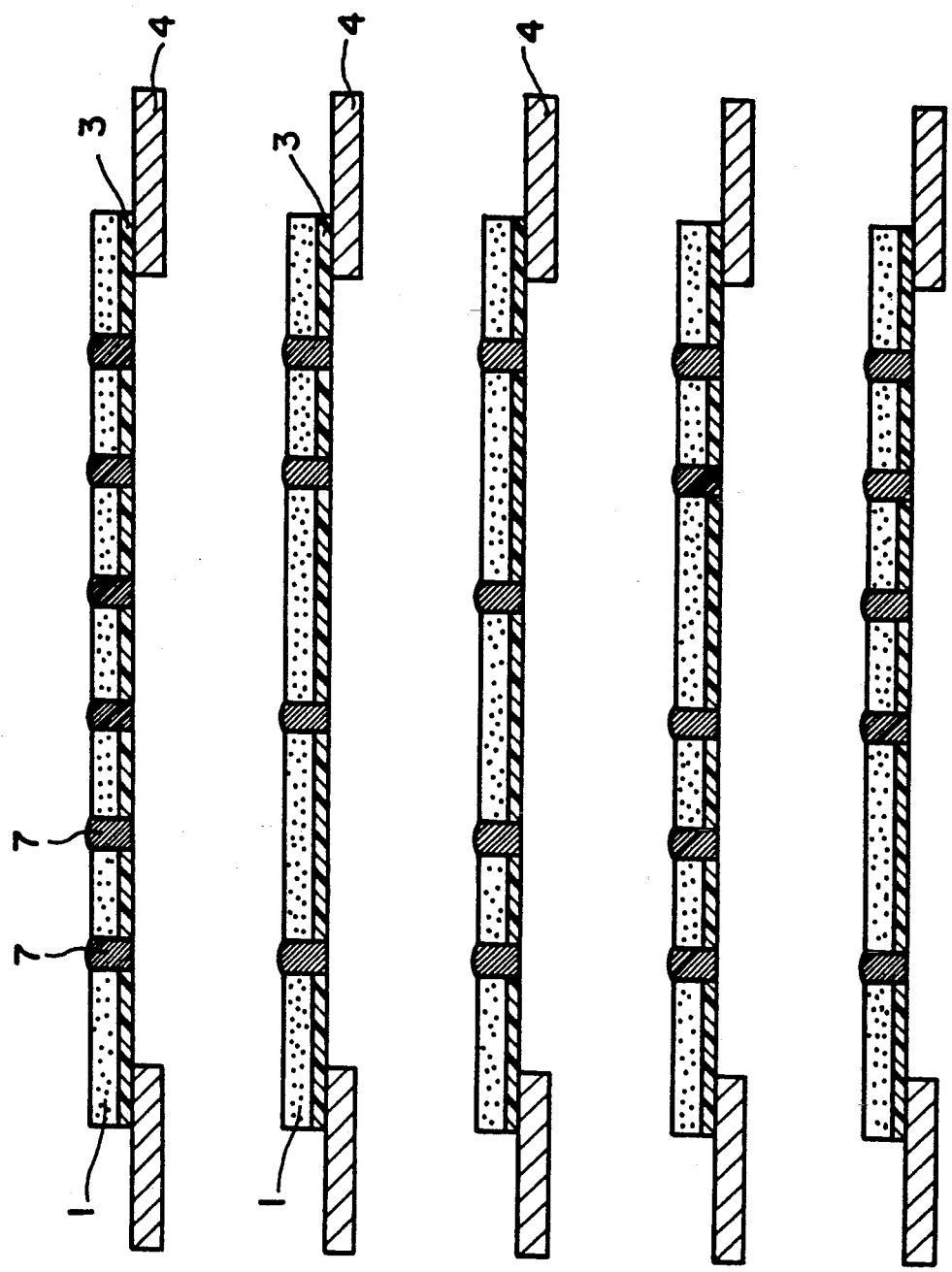

FIG. 34 shows in sectional view a state in which the carrier film 2 used as the mask during the via-filling has been removed from the surface of the ceramic greensheet 1 and the surface of the ceramic greensheet 1 is exposed.

Figure 35:
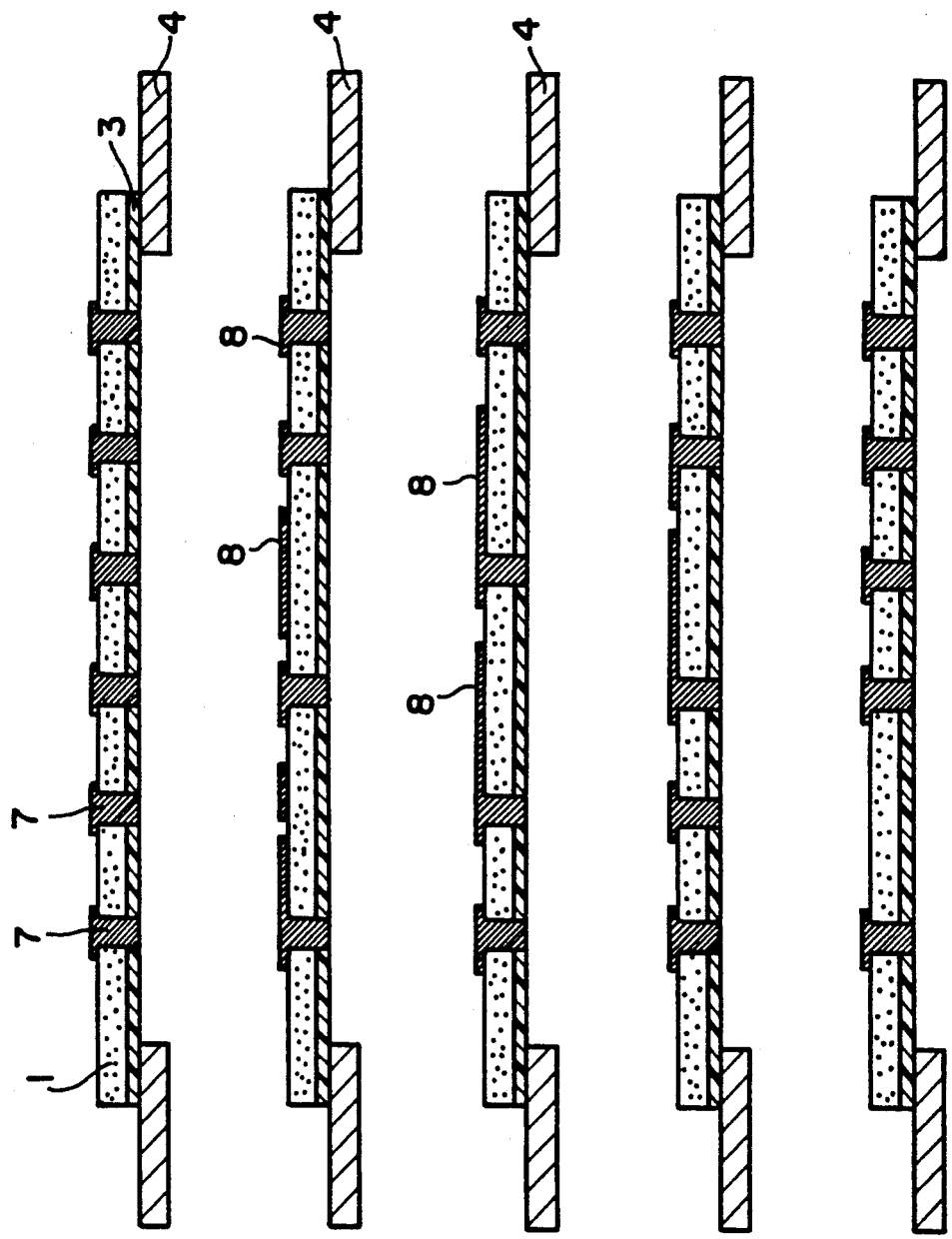

FIG. 35 shows in sectional view a state in which a conductive pattern 8 is formed on the exposed surface of the greensheet 1 by a screen printing method.

FIGS. 36-40 each shows a greensheet laminate assembly in which the ceramic greensheets 1 each provided with the through-hole and the via-fill and conductive pattern printing in the manner as explained above are stacked one on top of another in a laminating metal die 10.

Here, in the same manner as shown in FIG. 8, solid ceramic greensheets are stacked in advance in a lower metal die, which become a base 9. As shown in FIG. 9, in order to keep the ceramic greensheets in a bonded state, an organic solvent 13 is applied on peripheral portions of the base 9 by using a dispenser 12.

Figure 36:
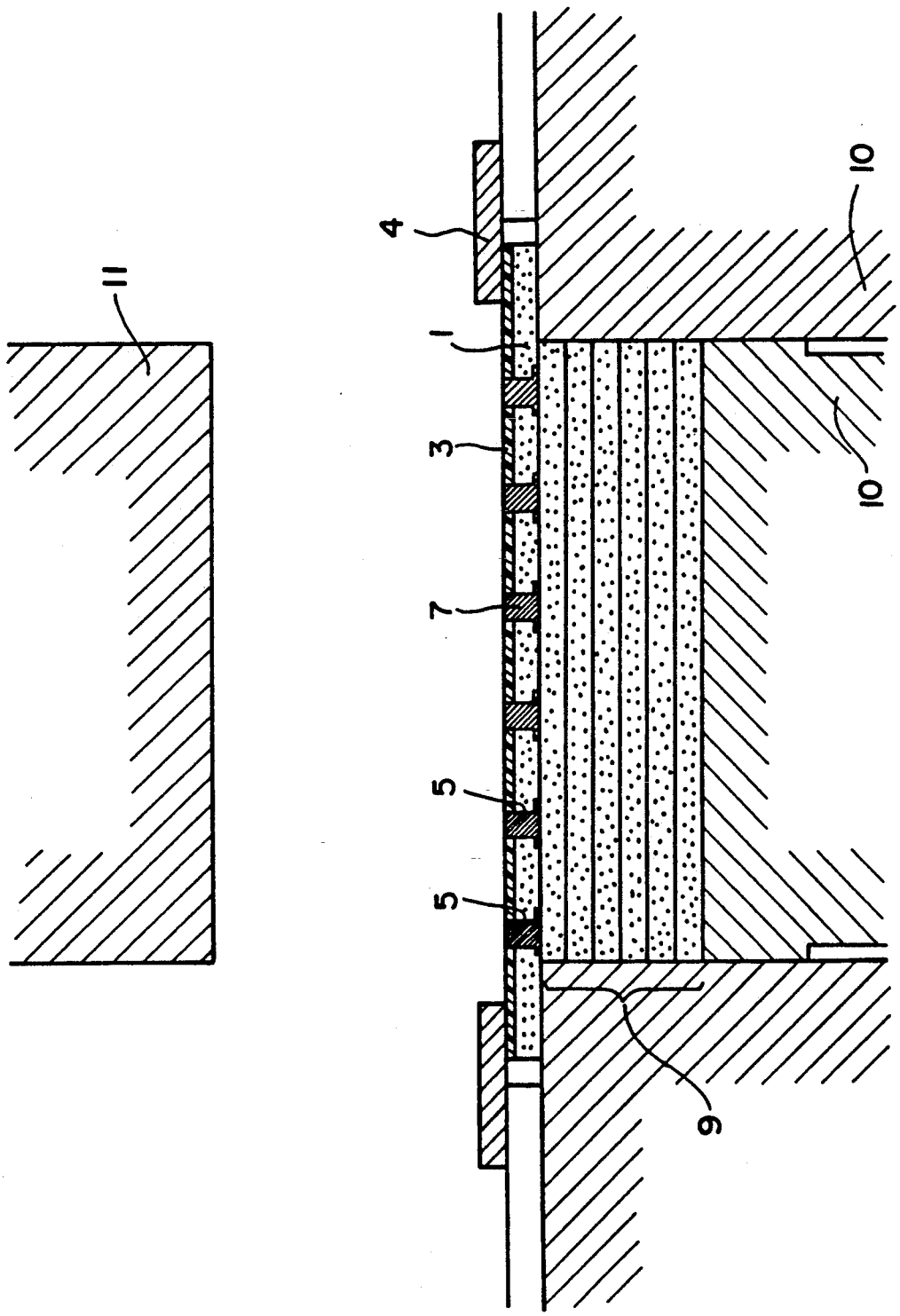
Figure 37:
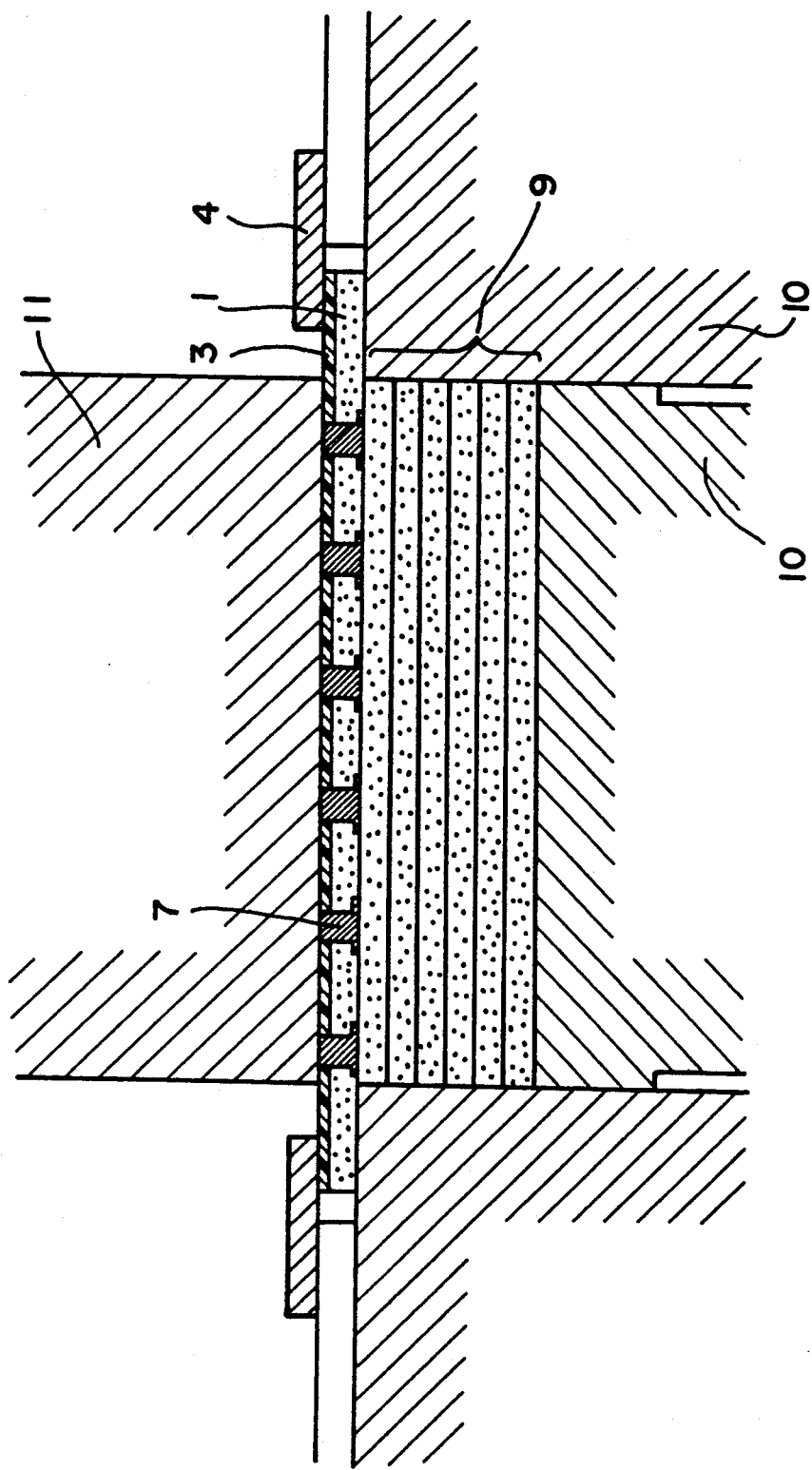

FIG. 36 shows a state in which the ceramic greensheet 1 is aligned and set on the base 9 and FIG. 37 shows a state in which both of them are pressed and bonded together.

Figure 38:
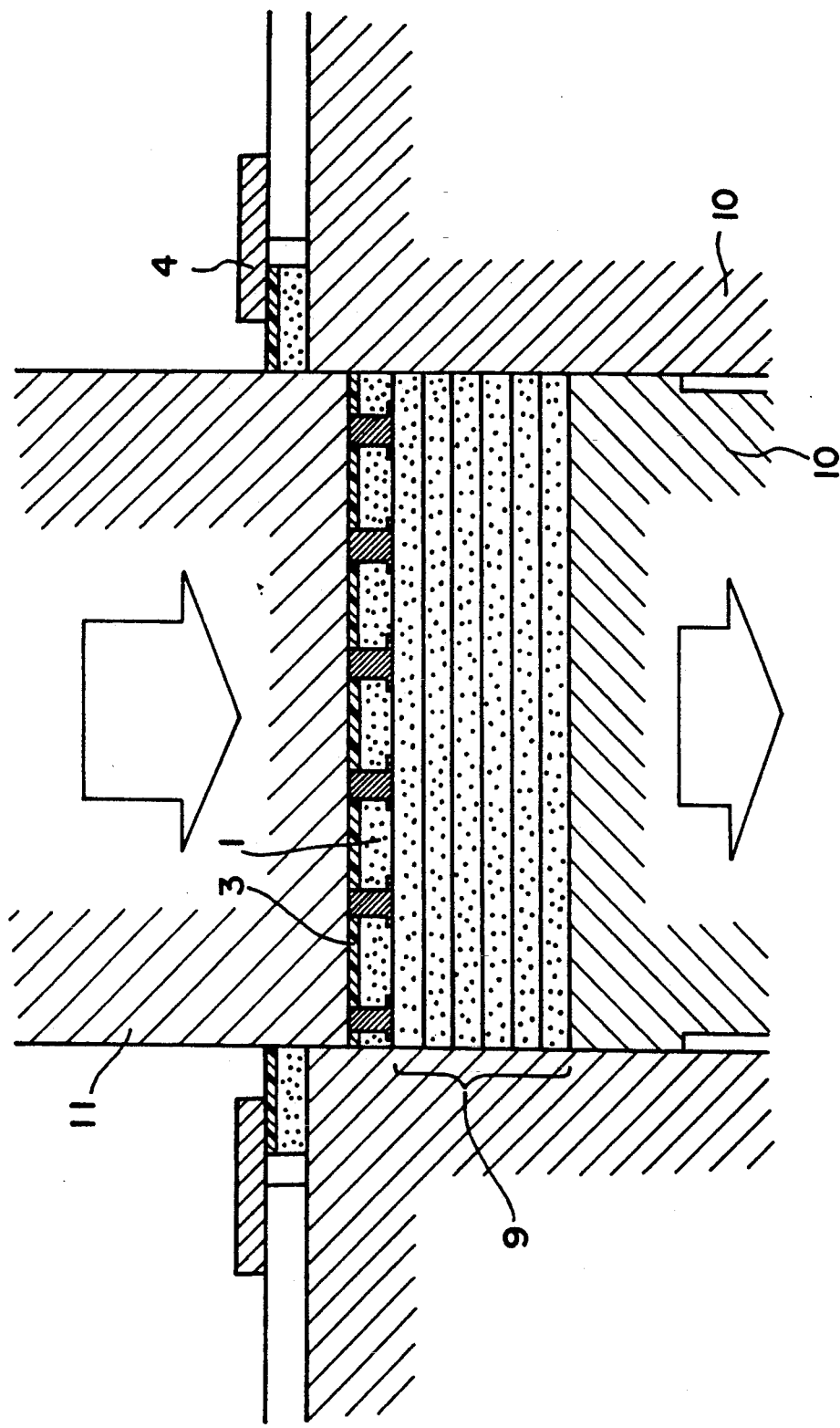
Figure 39:
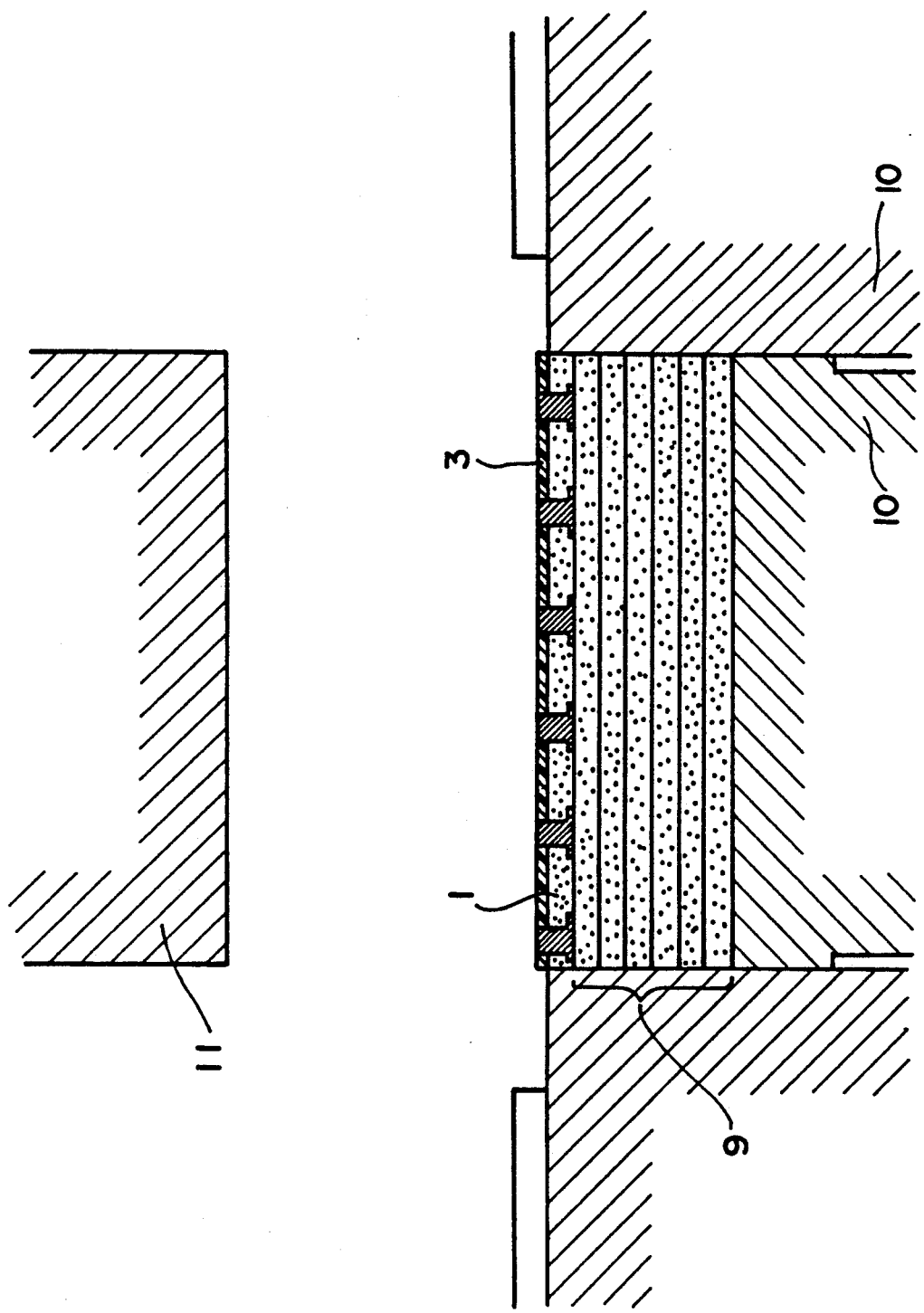
Figure 40:
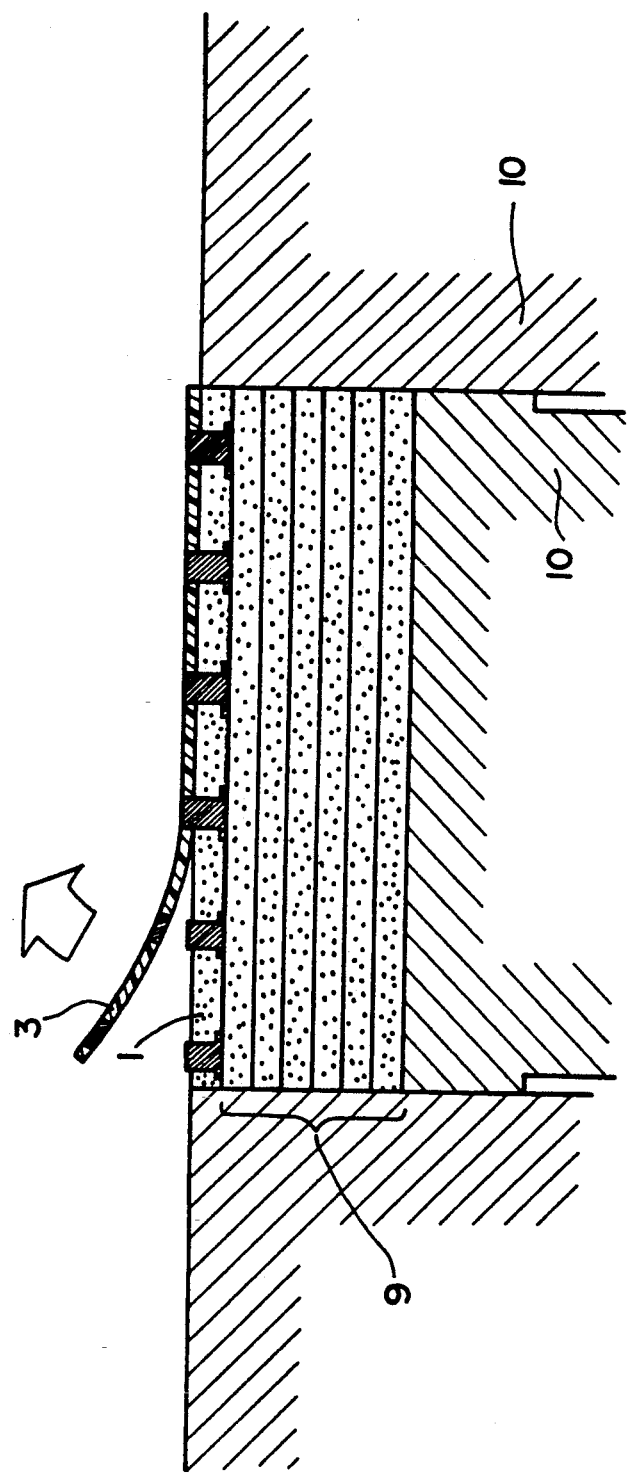

Subsequently, as shown in FIGS. 38 and 39, the ceramic greensheet 1 and the organic resin film 3 which carries it are cut by press. Then, as shown in FIG. 40, the organic resin film 3 carried by the greensheet 1 is removed. For further lamination of layers, the steps as illustrated by FIGS. 36–40 are repeated. In this manner, the laminate provisionally adhered at the peripheral portions of the base is prepared first so that the ceramic greensheets themselves are kept in an unmovable state and such laminate is subjected to thermal adhesion by press, which results in the ceramic greensheet assembly 14 as shown in FIG. 16. Then, the assembly undergoes the binder removal and the sintering processes, whereby the sintered ceramic structure 15 as shown in FIG. 17 is obtained.

The base is removed by a grinding process, whereby the through-holes are exposed. This provides the ceramic multi-layer substrate 16 as shown in FIG. 18.

As explained above, in the method for fabricating the ceramic multi-layer substrate according to the present invention, each of the process steps is carried out in the state in which the organic resin film or the carrier film remains on the greensheet and, in this way, it is possible to suppress to the minimum any deformation which may otherwise develop in the process steps. Whereas the displacement of through-holes in multi-layers when a greensheet with no film remaining thereon is processed by the conventional method has been about 60 μm, the present invention has made it possible to reduce such displacement to about 20 μm. This means that, the smaller the through-holes become in the future, more important this achievement is, in order to further enhance the integration or densities of the substrate.

More specifically, according to the invention, the organic resin film or the carrier film remains on the greensheet during the period in which the through-holes are formed, the conductive paste is filled in the through-holes, each of the processes for forming conductive patterns on the surface of the greensheet is conducted, the respective greensheets are stacked and provisionally bonded together, and the organic resin film is removed. In this way, it is possible to suppress the occurrence of deformation in dimensions of the greensheets in process and to suppress to the minimum any displacement in or misalignment of layers of greensheets after being laminated.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a ceramic multi-layer substrate by a greensheet process, said method comprising the steps of:
    a first step including bonding an organic resin film on a ceramic greensheet cast on a carrier film;
    a second step including forming a through-hole on said ceramic greensheet in a state in which this ceramic greensheet retains one or both of said films and filling conductive paste in said through-hole by using one of said films as a mask; and
    a third step including removing one of said films, placing said ceramic greensheet on a stack of ceramic greensheets forming a base, forming a laminate assembly by applying pressure thereto, and removing the other of said films remaining in said assembly.

2. A method for fabricating a ceramic multi-layer substrate by a greensheet process, said method comprising the steps of:
    a first step including bonding an organic resin film on a ceramic greensheet cast on a carrier film;
    a second step including forming a through-hole on said ceramic greensheet with this ceramic greensheet being sandwiched between said carrier film and said organic resin film and filling conductive paste in said through-hole by using said organic resin film as a mask; and
    a third step including removing only said organic resin film, placing said ceramic greensheet on a stack of ceramic greensheets forming a base, forming a laminate assembly by applying pressure thereto, and removing said carrier film from by said assembly.

3. A method for fabricating a ceramic multi-layer substrate according to claim 2, in which, after removal of said organic resin film in said second step, a conductive pattern is formed on an exposed surface of said ceramic greensheet.

4. A method for fabricating a ceramic multi-layer substrate according to claim 2, in which, following said first step, said ceramic greensheet sandwiched by said carrier film and said organic resin film is cut into desired sizes and peripheral portions of said carrier film are bonded to a frame for process handling.

5. A method for fabricating a ceramic multi-layer substrate by a greensheet process, said method comprising the steps of:
    a first step including bonding an organic resin film on a ceramic greensheet cast on a carrier film and removing them from said carrier film;
    a second step including forming a through-hole in said ceramic greensheet bonded on said organic resin film and filling conductive paste in said through-hole by using said organic resin film as a mask; and
    a third step including placing said ceramic greensheet on a stack of greensheets forming a base, forming a laminate assembly by applying pressure thereto, and removing said organic resin film from said assembly.

6. A method for fabricating a ceramic multi-layer substrate according to claim 5, in which, following said second step, a conductive pattern is formed on an exposed surface of said ceramic greensheet.

7. A method for fabricating a ceramic multi-layer substrate according to claim 5, in which, following said first step, said ceramic greensheet together with said organic resin film is cut into desired sizes and peripheral portions of said organic resin film are bonded to a frame for process handling.

8. A method for fabricating a ceramic multi-layer substrate by a greensheet process, said method comprising the steps of:
    a first step including bonding an organic resin film on a ceramic greensheet cast on a carrier film;
    a second step including forming a through-hole on said ceramic greensheet with this ceramic greensheet being sandwiched between said carrier film and said organic resin film and filling conductive paste in said through-hole by using said carrier film as a mask; and a third step including removing only said carrier film, placing said ceramic greensheet on a stack of ceramic greensheets forming a base, forming a laminate assembly by applying pressure thereto, and removing said organic resin film from said assembly.

9. A method for fabricating a ceramic multi-layer substrate according to claim 8, in which, after removal of said carrier film in said second step, a conductive pattern is formed on an exposed surface of said ceramic greensheet.

10. A method for fabricating a ceramic multi-layer substrate according to claim 8, in which, following said first step, said ceramic greensheet sandwiched between said carrier film and said organic resin film is cut into desired sizes and peripheral portions of said organic resin film are bonded to a frame for process handling.

* * * * *